(12) United States Patent  (10) Patent No.: US 9,412,798 B2
Yamazaki et al.  (45) Date of Patent: Aug. 9, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Hidekazu Miyairi, Isehara (JP); Kengo Akimoto, Atsugi (JP); Kojiro Shiraishi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/487,360

(22) Filed: Sep. 16, 2014

(65) Prior Publication Data

US 2015/0060850 A1 Mar. 5, 2015

Related U.S. Application Data

(60) Continuation of application No. 13/546,345, filed on Jul. 11, 2012, now Pat. No. 8,841,710, which is a division of application No. 12/511,247, filed on Jul. 29, 2009, now Pat. No. 8,293,595.

(30) Foreign Application Priority Data

Jul. 31, 2008 (JP) ................................. 2008-197127

(51) Int. Cl.
*H01L 27/32* (2006.01)
*H01L 27/01* (2006.01)
(Continued)

(52) U.S. Cl.
CPC .......... *H01L 27/3258* (2013.01); *H01L 27/016* (2013.01); *H01L 27/124* (2013.01);
(Continued)

(58) Field of Classification Search
CPC ... H01L 27/016; H01L 27/15; H01L 27/3225; H01L 27/3241; H01L 27/3248; H01L 27/3258
See application file for complete search history.

(56) References Cited

U.S. PATENT DOCUMENTS 5,313,075 A 5/1994 Zhang et al.
5,352,921 A 10/1994 Codama et al.
(Continued)

FOREIGN PATENT DOCUMENTS

CN 001260599 A 7/2000
CN 001287343 A 3/2001
(Continued)

OTHER PUBLICATIONS

Chinese Office Action (Application No. 201210278085.0) Dated Dec. 31, 2014.
(Continued)

*Primary Examiner* — Eduardo A Rodela
(74) *Attorney, Agent, or Firm* — Robinson Intellectual Property Law Office; Eric J. Robinson

(57) ABSTRACT

In an active matrix display device, electric characteristics of thin film transistors included in a circuit are important, and performance of the display device depends on the electric characteristics. Thus, by using an oxide semiconductor film including In, Ga, and Zn for an inverted staggered thin film transistor, variation in electric characteristics of the thin film transistor can be reduced. Three layers of a gate insulating film, an oxide semiconductor layer and a channel protective layer are successively formed by a sputtering method without being exposed to air. Further, in the oxide semiconductor layer, the thickness of a region overlapping with the channel protective film is larger than that of a region in contact with a conductive film.

19 Claims, 23 Drawing Sheets

(51) Int. Cl.
*H01L 27/15* (2006.01)
*H01L 27/12* (2006.01)
*H01L 29/45* (2006.01)
*H01L 29/49* (2006.01)
*H01L 29/786* (2006.01)
*H01L 29/51* (2006.01)
*H01L 21/02* (2006.01)

(52) U.S. Cl.
CPC ........ *H01L27/1225* (2013.01); *H01L 27/1255* (2013.01); *H01L 27/15* (2013.01); *H01L 27/3225* (2013.01); *H01L 27/3241* (2013.01); *H01L 27/3248* (2013.01); *H01L 29/45* (2013.01); *H01L 29/4908* (2013.01); *H01L 29/513* (2013.01); *H01L 29/518* (2013.01); *H01L 29/7869* (2013.01); *H01L 29/78618* (2013.01); *H01L 21/02554* (2013.01); *H01L 21/02565* (2013.01); *H01L 21/02631* (2013.01)

(56) References Cited

U.S. PATENT DOCUMENTS

| | | |
|---|---|---|
| 5,468,521 A | 11/1995 | Kanai et al. |
| 5,523,240 A | 6/1996 | Zhang et al. |
| 5,731,856 A | 3/1998 | Kim et al. |
| 5,744,864 A | 4/1998 | Cillessen et al. |
| 5,847,410 A | 12/1998 | Nakajima |
| 5,893,730 A | 4/1999 | Yamazaki et al. |
| 6,133,073 A | 10/2000 | Yamazaki et al. |
| 6,291,275 B1 | 9/2001 | Yamazaki et al. |
| 6,294,274 B1 | 9/2001 | Kawazoe et al. |
| 6,433,487 B1 | 8/2002 | Yamazaki |
| 6,458,637 B1 | 10/2002 | Yamazaki et al. |
| 6,555,969 B2 | 4/2003 | Yamazaki |
| 6,563,174 B2 | 5/2003 | Kawasaki et al. |
| 6,576,061 B1 | 6/2003 | Moriyama et al. |
| 6,586,346 B1 | 7/2003 | Yamazaki et al. |
| 6,607,947 B1 | 8/2003 | Zhang et al. |
| 6,674,495 B1 | 1/2004 | Hong et al. |
| 6,727,522 B1 | 4/2004 | Kawasaki et al. |
| 6,794,682 B2 | 9/2004 | Watanabe et al. |
| 6,806,169 B2 | 10/2004 | Gosain et al. |
| 6,858,308 B2 | 2/2005 | Kondo et al. |
| 6,960,812 B2 | 11/2005 | Yamazaki et al. |
| 7,012,300 B2 | 3/2006 | Yamazaki |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,115,913 B2 | 10/2006 | Shigeno |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,355,202 B2 | 4/2008 | Zhang et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,427,834 B2 | 9/2008 | Yamazaki |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,501,305 B2 | 3/2009 | Takai et al. |
| 7,601,994 B2 | 10/2009 | Fukuchi et al. |
| 7,674,650 B2 | 3/2010 | Akimoto et al. |
| 7,710,028 B2 | 5/2010 | Yamazaki |
| 7,732,819 B2 | 6/2010 | Akimoto et al. |
| 7,749,825 B2 | 7/2010 | Honda |
| 7,767,106 B2 | 8/2010 | Chang |
| 7,816,680 B2 | 10/2010 | Kim et al. |
| 7,883,912 B2 | 2/2011 | Fukuchi et al. |
| 7,884,360 B2 | 2/2011 | Takechi et al. |
| 7,906,777 B2 | 3/2011 | Yano et al. |
| 7,910,920 B2 | 3/2011 | Park et al. |
| 7,923,723 B2 | 4/2011 | Hayashi et al. |
| 8,093,589 B2 | 1/2012 | Sugihara et al. |
| 8,143,115 B2 | 3/2012 | Omura et al. |
| 8,148,721 B2 * | 4/2012 | Hayashi ............... H01L 29/7869 257/43 |
| 8,198,806 B2 | 6/2012 | Yamazaki |
| 8,222,098 B2 | 7/2012 | Honda |
| 8,293,595 B2 | 10/2012 | Yamazaki et al. |
| 8,358,063 B2 | 1/2013 | Yamazaki |
| 8,420,442 B2 | 4/2013 | Takechi et al. |
| 8,785,990 B2 | 7/2014 | Honda |
| 2001/0011726 A1 | 8/2001 | Hayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0168878 A1 | 11/2002 | Batey et al. |
| 2002/0175328 A1* | 11/2002 | Tsunoda ............... H01L 27/1214 257/59 |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0012097 A1 | 1/2005 | Yamazaki |
| 2005/0017302 A1 | 1/2005 | Hoffman |
| 2005/0020006 A1 | 1/2005 | Zhang et al. |
| 2005/0094041 A1 | 5/2005 | Oh et al. |
| 2005/0127380 A1 | 6/2005 | Kawasaki et al. |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |

(56) References Cited

U.S. PATENT DOCUMENTS

| | | |
|---|---|---|
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0283842 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0101910 A1 | 4/2009 | Zhang et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0267064 A1 | 10/2009 | Yano et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0289258 A1 | 11/2009 | Kim et al. |
| 2009/0294808 A1 | 12/2009 | Ito |
| 2010/0025678 A1 | 2/2010 | Yamazaki et al. |
| 2010/0051936 A1 | 3/2010 | Hayashi et al. |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0171120 A1 | 7/2010 | Gosain et al. |
| 2011/0065216 A1 | 3/2011 | Kaji et al. |
| 2011/0175090 A1 | 7/2011 | Sugihara et al. |
| 2012/0132908 A1 | 5/2012 | Sugihara et al. |
| 2012/0168750 A1 | 7/2012 | Hayashi et al. |
| 2012/0267633 A1 | 10/2012 | Hayashi et al. |
| 2012/0318447 A1 | 12/2012 | Ozawa |
| 2013/0237012 A1 | 9/2013 | Takechi et al. |
| 2014/0326998 A1 | 11/2014 | Honda |

FOREIGN PATENT DOCUMENTS

| | | |
|---|---|---|
| CN | 001447156 A | 10/2003 |
| CN | 001532947 A | 9/2004 |
| CN | 001806322 A | 7/2006 |
| CN | 001906527 A | 1/2007 |
| CN | 101032027 A | 9/2007 |
| EP | 0459763 A | 12/1991 |
| EP | 1014426 A | 6/2000 |
| EP | 1081767 A | 3/2001 |
| EP | 1701396 A | 9/2006 |
| EP | 1737044 A | 12/2006 |
| EP | 2226847 A | 9/2010 |
| EP | 2264770 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-164042 A | 6/1990 |
| JP | 03-231472 A | 10/1991 |
| JP | 04-165679 A | 6/1992 |
| JP | 04-284630 A | 10/1992 |
| JP | 05-251704 A | 9/1993 |
| JP | 05-251705 A | 9/1993 |
| JP | 07-066423 A | 3/1995 |
| JP | 07-221316 A | 8/1995 |
| JP | 08-264794 A | 10/1996 |
| JP | 11-505377 | 5/1999 |
| JP | 2000-044236 A | 2/2000 |
| JP | 2000-058836 A | 2/2000 |
| JP | 2000-150900 A | 5/2000 |
| JP | 2000-200898 A | 7/2000 |
| JP | 2002-076356 A | 3/2002 |
| JP | 2002-289859 A | 10/2002 |
| JP | 2002-368229 A | 12/2002 |
| JP | 2003-086000 A | 3/2003 |
| JP | 2003-086808 A | 3/2003 |
| JP | 2003-273366 A | 9/2003 |
| JP | 2004-103957 A | 4/2004 |
| JP | 2004-273614 A | 9/2004 |
| JP | 2004-273732 A | 9/2004 |
| JP | 2005-020023 A | 1/2005 |
| JP | 2005-077822 A | 3/2005 |
| JP | 2005-203678 A | 7/2005 |
| JP | 2006-186119 A | 7/2006 |
| JP | 2007-096055 A | 4/2007 |
| JP | 2007-123861 A | 5/2007 |
| JP | 2007-134687 A | 5/2007 |
| JP | 2007-250982 A | 9/2007 |
| JP | 2007-250983 A | 9/2007 |
| JP | 2007-299913 A | 11/2007 |
| JP | 2008-042067 A | 2/2008 |
| JP | 2008-042088 A | 2/2008 |
| JP | 2008-060419 A | 3/2008 |
| JP | 2008-140984 A | 6/2008 |
| JP | 2008-153550 A | 7/2008 |
| JP | 2008-166716 A | 7/2008 |
| JP | 2009-135380 A | 6/2009 |
| JP | 2010-056546 A | 3/2010 |
| WO | WO-2004/114391 | 12/2004 |
| WO | WO-2005/047968 | 5/2005 |
| WO | WO-2006/025609 | 3/2006 |
| WO | WO-2007/043493 | 4/2007 |
| WO | WO-2007/058232 | 5/2007 |
| WO | WO-2007/108293 | 9/2007 |
| WO | WO-2007/119386 | 10/2007 |
| WO | WO-2008/069056 | 6/2008 |
| WO | WO-2008/069255 | 6/2008 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFe2O4, and YB2Fe3O7 Types of Structures for Compounds in the In2O3 and Sc2O3—A2O3—BO Systems [A; Fe, Ga, Or Al; B: Mg, Mn, Fe, Ni, Cu,Or Zn] at Temperatures Over 1000 ° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol 26, pp. 181-184.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 200910159685.3) Dated Oct. 15, 2012.

Chinese Office Action (Application No. 201210278085.0) Dated Jun. 5, 2014.

* cited by examiner

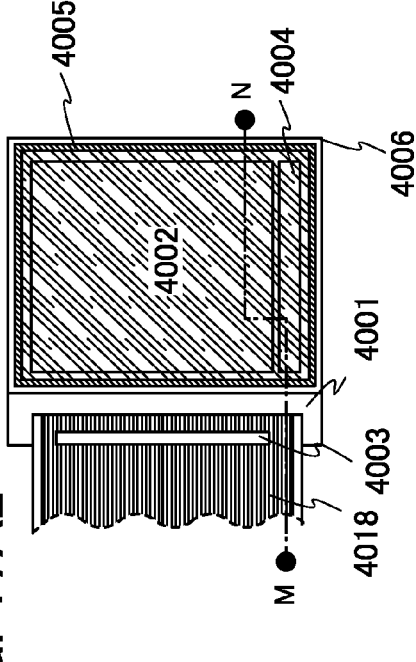
FIG. 17A1
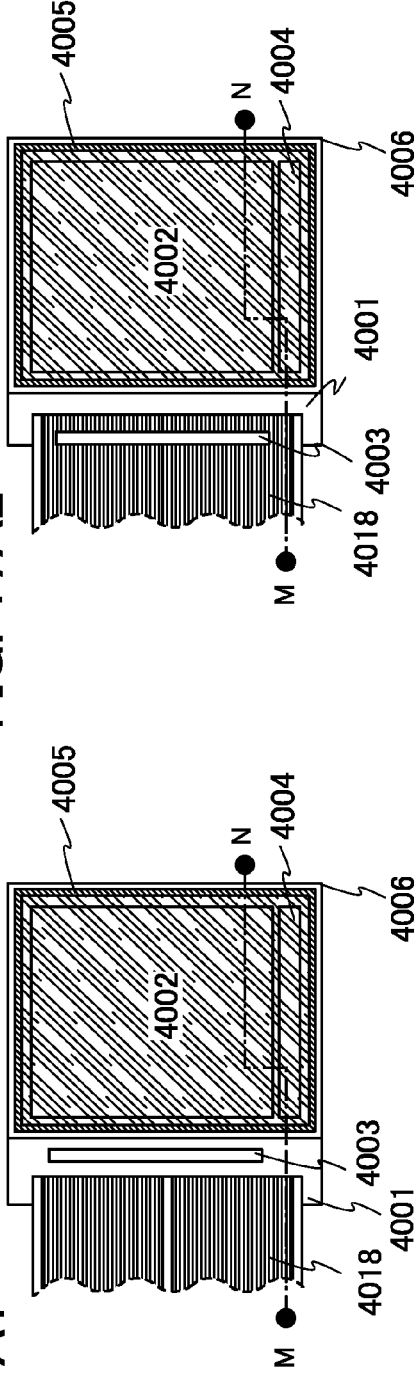
FIG. 17A2
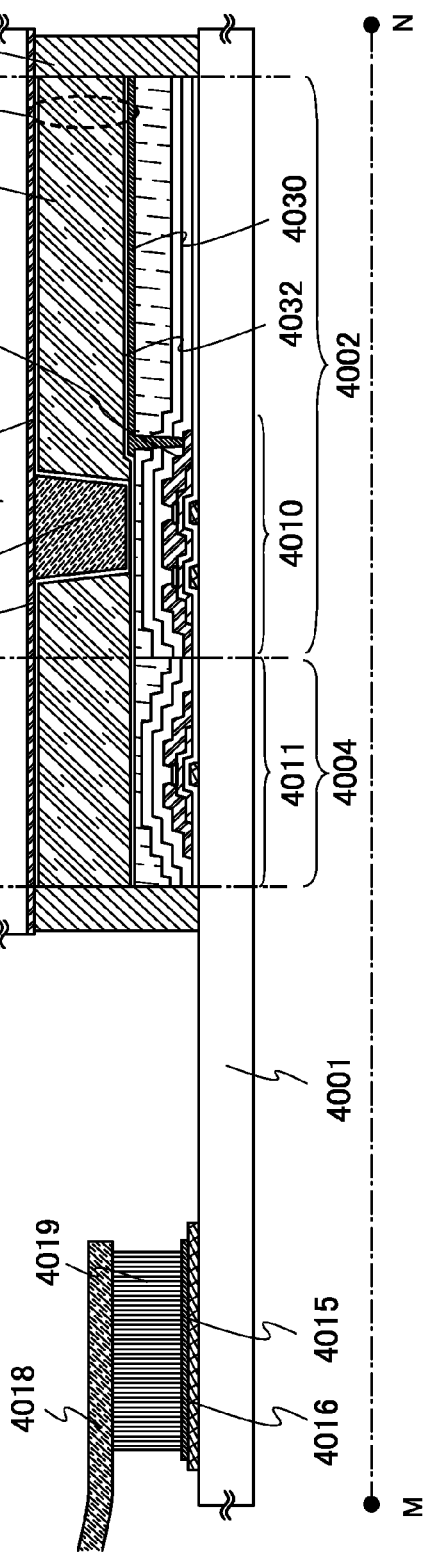
FIG. 17B

SEMICONDUCTOR DEVICE AND METHOD FOR MANUFACTURING THE SAME

FIELD OF THE INVENTION

The present invention relates to a semiconductor device which has a circuit including a thin film transistor (hereinafter, referred to as a TFT) in which an oxide semiconductor film is used for a channel formation region and a manufacturing method thereof. For example, the present invention relates to an electronic device in which an electro-optical device typified by a liquid crystal display panel or a light-emitting display device including an organic light-emitting element is mounted as its component.

Note that the term "semiconductor device" in this specification indicates all the devices which can operate by using semiconductor characteristics, and an electro-optical device, a semiconductor circuit, and an electronic device are all included in the semiconductor devices.

DESCRIPTION OF THE RELATED ART

In recent years, active matrix display devices (such as liquid crystal display devices, light-emitting display devices, or electrophoretic display devices), in which a switching element of a TFT is provided for each of display pixels arranged in a matrix, have been actively developed. In the active matrix display devices, a switching element is provided for each of pixels (or each dot), and thus, there is such an advantage that the active matrix display device can be driven at lower voltage than a passive matrix display device in the case where the pixel density is increased.

In addition, a technique has attracted attention, where a thin film transistor (TFT) in which an oxide semiconductor film is used for a channel formation region or the like is manufactured and such a TFT or the like is applied to electronic devices or optical devices. For example, a TFT in which ZnO is used as an oxide semiconductor film or a TFT in which $InGaO_3(ZnO)_m$ is used as an oxide semiconductor film can be given. A technique in which a TFT including such an oxide semiconductor film is formed over a light-transmitting substrate and used for a switching element or the like of an image display device is disclosed in Patent Document 1 or Patent Document 2.

Patent Document 1: Japanese Published Patent Application No. 2007-123861
Patent Document 2: Japanese Published Patent Application No. 2007-96055

SUMMARY OF THE INVENTION

In an active matrix display device, electric characteristics of thin film transistors included in a circuit are important, and performance of the display device depends on the electric characteristics. In particular, the threshold voltage (Vth) is important among the electric characteristics of the thin film transistor. When the threshold voltage value is high or the threshold voltage value is on the minus side even if the field-effect mobility is high, it is difficult to control the circuit. When a thin film transistor has a high threshold voltage value and a large absolute value of its threshold voltage, the thin film transistor cannot perform switching function and may be a load when the transistor is driven at low voltage. Further, in the case where the threshold voltage value is on the minus side, current tends to flow between the source electrode and the drain electrode even when the gate voltage is 0V; in other words, the thin film transistor tends to be normally on.

In a case of an n-channel thin film transistor, a preferable thin film transistor is one in which a channel is formed and drain current begin to flow after the positive voltage is applied as the gate voltage. A transistor in which a channel is not formed unless the driving voltage is increased and a transistor in which a channel is formed and drain current flows even in the case of the negative voltage state are unsuitable for a thin film transistor used in a circuit.

It is an object to provide a structure in which a channel is formed with a positive threshold voltage of a gate voltage which is as close to 0V as possible in a thin film transistor using an oxide semiconductor film including In, Ga, and Zn.

Further, another object is to reduce variation in electric characteristics of the thin film transistor in which an oxide semiconductor film including In, Ga, and Zn is used. In particular, in a liquid crystal display device where variation between elements is large, there is a concern that display unevenness due to variation in the TFT characteristics is caused.

Further, in a display device including a light-emitting element, in a case where there is large variation in ON current (Ion) of TFTs (TFTs in a driver circuit or TFTs for supplying current to light-emitting elements arranged in pixels) arranged so as to make constant current flow to a pixel electrode, there is a concern that variation in luminance might be generated in a display screen.

SUMMARY OF THE INVENTION

The threshold voltage of a thin film transistor is considered to be greatly influenced by an interface of an oxide semiconductor layer, that is, an interface between an oxide semiconductor layer and a gate insulating film or an interface between an oxide semiconductor layer and an electrode.

Thus, by formation of the interface in a clean condition, in addition to improving electric characteristics of a thin film transistor, a manufacturing process can be prevented from being complicated, so that a thin film transistor provided with improved mass productivity and high performance can be realized.

Such an interface is formed in a clean condition, and thus three layers, a gate insulating film, an oxide semiconductor layer and a channel protective layer are successively formed by a sputtering method or a PCVD method without being exposed to air. Preferably, the three layers are successively formed under reduced pressure so that an oxide semiconductor layer having an excellent interface can be obtained, and leakage current of a TFT in an off state can be small and a thin film transistor having high current-driving ability can be obtained.

One embodiment of the present invention disclosed in this specification is a method for manufacturing a semiconductor device, comprising the steps of: forming a gate electrode over a substrate having an insulating surface; forming a stacked layer in which a first insulating film is formed over the gate electrode, an oxide semiconductor layer is formed over the first insulating film, and a second insulating film is formed over the oxide semiconductor layer by sputtering without being exposed to air; forming a protective film in a region overlapping with the gate electrode by selectively etching the second insulating film; etching an upper layer of the oxide semiconductor layer with the protective film as a mask; forming a conductive film over the oxide semiconductor layer and the protective film; and selectively etching the conductive film with the protective film used as an etching stopper.

The present invention can achieve at least one of the above-described objects.

In the above-described manufacturing process, the first insulating film and the oxide semiconductor layer can be formed in the same chamber. The interface between the first insulating film and the oxide semiconductor layer is close to a region of a channel and thus the formation in the same chamber is effective for improvement in electric characteristics of a TFT, e.g., improvement in electric field mobility. In addition, the interface between the first insulating film and the oxide semiconductor layer becomes clean, and thus variations in a threshold voltage value or on current (Ion) can be reduced. Advantages of stacking the films in the same chamber are that the number of chambers used can be decreased and attachment of particles, moisture or the like to a substrate can be prevented in transferring the substrate from a chamber to another chamber.

Moreover, in the above-described manufacturing process, the first insulating film, the oxide semiconductor layer and the second insulating film can be formed in the same chamber. The interface between the second insulating film and the oxide semiconductor layer is close to a path of leakage current in an off state and thus the formation in the same chamber is effective for improvement in electric characteristics of a TFT, e.g., reduction of leakage current in an off state. In addition, the interface between the second insulating film and the oxide semiconductor layer becomes clean as well as the interface between the first insulating film and the oxide semiconductor layer, and thus variations of elements can be reduced.

Also, one feature of the above-described manufacturing process is that the first insulating film is formed in an atmosphere including only oxygen or an atmosphere including an inert gas at less than 10% and oxygen at 90% or more by a sputtering method. The target can be an insulating material, a metal material or a semiconductor material. The first insulating film including excessive oxygen can be obtained by a sputtering method. Further, an oxide semiconductor layer having excessive oxygen is formed over the first insulating film including excessive oxygen, so that the interface between the films each including excessive oxygen can be stable and reliability of a TFT can be improved.

Further, one feature is that an oxide semiconductor target including at least In, Ga, and Zn is used and an oxide semiconductor layer is formed under an atmosphere including only oxygen or an atmosphere containing an inert gas at less than 10% and oxygen at 90% or more by a sputtering method. For the formation of the oxide semiconductor layer, a vapor phase method such as a pulsed laser deposition method (a PLD method) or an electron beam deposition method can be used, but a sputtering method is suitable in terms of mass productivity.

Also, one feature is that the second insulating film is formed under an atmosphere including only oxygen or an atmosphere containing an inert gas at less than 10% and oxygen at 90% or more by a sputtering method. The SiOx film including excessive oxygen, and the IGZO semiconductor layer including excessive oxygen and the channel protective layer including excessive oxygen are successively formed without being exposed to air, so that the interfaces between the three layers is more stable because the three layers are all films including excessive oxygen. Thus, the reliability of a TFT can be improved. By successive formation of the three layers, variations in threshold voltages can be reduced, deterioration of electric characteristics can be prevented, and shift to normally on of a TFT can be reduced, or preferably eliminated.

In this specification, the term "successive deposition" or "successive formation" means that deposition is conducted to a substrate to be processed placed under an atmosphere which is controlled to be vacuum or an inert gas atmosphere (a nitrogen atmosphere or a rare gas atmosphere) at all times without being exposed to a contaminant atmosphere such as air during a series of processes from a first deposition step using a sputtering method or a PCVD method to a second deposition step using a sputtering method or a PCVD method. By the successive formation, deposition can be performed while preventing moisture or the like from being attached again to the substrate to be processed which is cleaned.

Performing the process from the first deposition step to the second deposition step in the same chamber is within the scope of the successive formation in this specification.

In addition, the following is also within the scope of the successive formation in this specification: in the case of performing the process from the first deposition step to the second deposition in different chambers, the substrate is transferred after the first deposition step to another chamber without being exposed to air and subjected to the second deposition.

Note that between the first deposition step and the second deposition step, a substrate transfer step, an alignment step, a slow-cooling step, a step of heating or cooling the substrate to a temperature which is necessary for the second deposition step, and/or the like may be provided. Such a process is also within the scope of the successive formation in this specification.

A step in which liquid is used, such as a cleaning step, wet etching, or formation of a resist may be provided between the first deposition step and the second deposition step. This case is not included in the successive formation in this specification.

In addition, in the above-described manufacturing method, when or after pattering is performed to form the channel protective film, a part of the oxide semiconductor layer is intentionally etched to form a region with a small thickness. Accordingly, by the manufacturing method according to one embodiment of the present invention, as for the oxide semiconductor layer, the thickness of a region overlapping the channel protective film can be larger than a region overlapping the conductive film.

As described above, the structure of the semiconductor device obtained by the above-described manufacturing method is also one feature of one embodiment of the present invention. The structure includes a gate electrode over a substrate having an insulating surface, a first insulating film over the gate electrode, an oxide semiconductor layer over the first insulating film, and a second insulating film and a conductive film over the oxide semiconductor layer, and a first region in which the oxide semiconductor layer and the second insulating film are in contact with each other overlaps with at least part of the gate electrode, and a thickness of the oxide semiconductor layer in a second region in which the oxide semiconductor layer and the conductive film are in contact with each other is smaller than a thickness of the oxide semiconductor layer in the first region.

In the above-described structure, the oxide semiconductor layer is an oxide semiconductor film including at least In, Ga and Zn. The oxide semiconductor film including In, Ga and Zn (also referred to as an IGZO film) has characteristics that its hole mobility is increased as its carrier concentration becomes higher. In addition, the oxide semiconductor film including at least In, Ga and Zn has an electron carrier concentration of from $1\times10^{11}$ cm$^{-3}$ to $1\times10^{17}$ cm$^{-3}$ at room temperature in a state that a gate voltage and a source-drain voltage are not applied. If the oxide semiconductor layer of the thin film transistor exceeds the electron carrier concentration range, the threshold voltage is easily shifted to a minus value, and the thin film transistor tends to be normally on, the state that current flows between a source electrode and a drain electrode even at a gate voltage of 0 V.

With the above-described structure, a structure can be realized in which a channel can be formed with a positive threshold voltage of a gate voltage which is as close to 0V as possible in a thin film transistor using an oxide semiconductor film including In, Ga, and Zn.

In addition, the first insulating film is used as the gate insulating film, and thus a material which has excellent interface characteristics with the oxide semiconductor layer formed thereover is preferably used for the first insulating film. For example, a silicon oxide film, an aluminum oxide film, a magnesium oxide film, an aluminum nitride film, an yttrium oxide film, or the like formed by a sputtering method can be given. Alternatively, a multilayer structure in which plural kinds of such films are stacked may be employed. The thickness of the first insulating film may be determined in consideration of the use as the gate insulating film. The typical thickness of the gate insulating film is from 50 nm to 500 nm.

The second insulating film is used as the channel protective film, and thus a material which has excellent interface characteristics with the oxide semiconductor layer formed thereunder is preferably used for the second insulating film. For example, a silicon oxide film, an aluminum oxide film, a magnesium oxide film, an aluminum nitride film, an yttrium oxide film, or the like formed by a sputtering method can be given. Because the second insulating film serves as the channel protective film, a damage (such as thickness reduction or oxidation due to plasma etching or etchant in etching) to a back channel, that is, a region opposite to a face of the IGZO semiconductor layer that is in contact with the gate insulating film can be prevented during a process, and thus the reliability of the semiconductor device can be improved.

In addition, a small amount of a halogen element such as fluorine or chlorine may be added to the first insulating film or the second insulating film to immobilize mobile ions of sodium or the like. The peak of the concentration of a halogen element to be contained in the first insulating film or the second insulating film is measured by secondary ion mass spectrometry (SIMS) and is preferably in the range of from $1\times10^{15}$ cm$^{-3}$ to $1\times10^{20}$ cm$^{-3}$. The halogen element included in the first insulating film or the second insulating film has an effect of preventing electric characteristics of a TFT from varying due to entry of mobile ions of sodium or the like from a glass substrate including an alkali metal such as sodium.

The conductive film serves as a source electrode or a drain electrode. The conductive film is formed using a single layer or a stacked layer of aluminum, copper, or an aluminum alloy to which an element to improve heat resistance or an element to prevent a hillock such as silicon, titanium, neodymium, scandium, or molybdenum is added. Among all, titanium can be given as an example of a material having excellent interface characteristics with the oxide semiconductor layer. In particular, a stack of a titanium film, an aluminum film, and a titanium film is used as the conductive layer so that its resistance is low, and the titanium films sandwich the aluminum film, thereby almost preventing hillocks generated from the aluminum film. Thus, the stack is suitable for a source electrode or a drain electrode.

Alternatively, between the gate electrode and the first insulating film formed by a sputtering method, a silicon nitride film or a silicon nitride oxide film may be additionally provided. In other words, the gate insulating film may have a stacked structure of two or more layers, and a silicon oxide film formed by a sputtering method is preferable for the first insulating film as a top layer in contact with the oxide semiconductor layer, while the insulating film formed thereunder is preferably a silicon nitride film or a silicon nitride oxide film formed by a plasma CVD method or the like. By provision of such a silicon nitride film or a silicon nitride oxide film formed by a plasma CVD method or the like, the film serves as an etching stopper to prevent a surface of a substrate from being etched in a manufacturing process of a TFT. The silicon nitride film or the silicon nitride oxide film can prevent mobile ions of sodium or the like included in a glass substrate from entering a semiconductor region so that variation in electric characteristics of TFTs can be suppressed.

Note that a "silicon oxynitride film" in this specification means a film that contains more oxygen than nitrogen and includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively, in the case of measurement using Rutherford backscattering spectrometry (RBS) and hydrogen forward scattering (HFS). Further, a "silicon nitride oxide film" in this specification means a film that contains more nitrogen than oxygen and includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively, in the case of measurement using RBS and HFS. Note that percentages of nitrogen, oxygen, silicon, and hydrogen fall within the ranges given above, where the total number of atoms contained in the silicon oxynitride film or the silicon nitride oxide film is defined as 100 at. %.

Note that in this specification, a word which expresses up, down, side, perpendicular, horizontal, or the like indicates a direction based on a surface of the substrate in the case where a device is disposed on the substrate surface.

Because the three layers are formed successively, a structure can be realized in which a channel can be formed with a positive threshold voltage of a gate voltage which is as close to 0V as possible in a thin film transistor using an oxide semiconductor film including In, Ga, and Zn. Moreover, because the three layers are formed successively, variations in threshold voltages can be reduced, deterioration of electric characteristics can be prevented, and shift to normally on of a TFT can be reduced, or preferably eliminated.

BRIEF DESCRIPTION OF THE DRAWINGS

In the accompanying drawings:

FIGS. 17A1 and 17A2 are top views of a liquid crystal module, and FIG. 17B is a cross-sectional view of the liquid crystal module;

DETAILED DESCRIPTION OF THE INVENTION

One embodiment of the present invention will now be described.

Embodiment 1

In Embodiment 1, a thin film transistor and a manufacturing process thereof are described with reference to FIGS. 1A to 1E and FIG. 2.

Figure 1A:
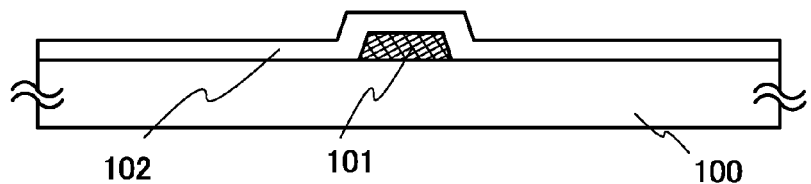
FIGS. 1A to 1E are cross-sectional views illustrating a manufacturing process according to one embodiment of the present invention.

A gate electrode 101 is formed over a substrate 100 first, and a first insulating film 102 is formed so as to cover the gate electrode 101 (FIG. 1A).

As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, a metal substrate such as a stainless steel alloy substrate, provided with an insulating film over its surface, may also be used. The substrate 100 may have a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like.

Alternatively, a base insulating film may be formed over the substrate 100 before the gate electrode 101 is formed. The base insulating film can be formed with a single layer or stacked layers of a silicon oxide film, a silicon nitride film, a silicon oxynitride film, and/or a silicon nitride oxide film by a CVD method, a sputtering method, or the like.

The gate electrode 101 is formed using a metal material such as titanium, molybdenum, chromium, tantalum, tungsten, silver, gold, copper, or aluminum or an alloy material thereof. For example, the gate electrode 101 can be formed using CuO, Cu—Mg—O, Cu—Ca—O, Cu—Mn—O, an Al—Ni alloy, as Al—Ni—La alloy, an Al—Nd alloy or the like. The gate electrode 101 can be formed in such a manner that a conductive film is formed over the substrate 100 by a sputtering method or a vacuum evaporation method; a mask is formed over the conductive film by a photolithography process or an inkjet method; and the conductive film is etched using the mask. Alternatively, the gate electrode 101 can be formed by discharging a conductive nanopaste of silver, gold, copper, or the like by an inkjet method and baking the conductive nanopaste. Note that, as barrier metal which increases adhesion of the gate electrode 101 and prevents diffusion thereof to the substrate or to the base film, a nitride film of the above-mentioned metal material may be provided between the substrate 100 and the gate electrode 101. The gate electrode 101 may have a single-layer structure or a stacked structure. For example, a structure in which a molybdenum film and an aluminum film are stacked in this order, a structure in which a molybdenum film and an alloy film of aluminum and neodymium are stacked in this order, a structure in which a titanium film and an aluminum film are stacked in this order, a structure in which a titanium film, an aluminum film, and a titanium film are stacked in this order, or the like can be formed over the substrate 100.

In this case, a stacked layer of an aluminum film and a molybdenum film is formed by a sputtering method and is selectively etched by a photolithography process. At this time, a first photomask is used. Note that, because a semiconductor film and/or a wiring is/are to be formed over the gate electrode 101, the gate electrode 101 is preferably processed to have tapered end portions in order to prevent breakage of the film to be formed thereover.

The first insulating film 102 can be formed by a CVD method, a sputtering method, or the like using a silicon oxide film, a silicon nitride film, a silicon oxynitride film, or a silicon nitride oxide film. The first insulating film 102 is the first layer of a gate insulating film. In this case, the first insulating film 102 is a silicon nitride film formed by a plasma CVD method. The silicon nitride film has an effect of preventing hillock generation, when a material that may cause hillocks is used for the gate electrode 101.

Figure 1B:
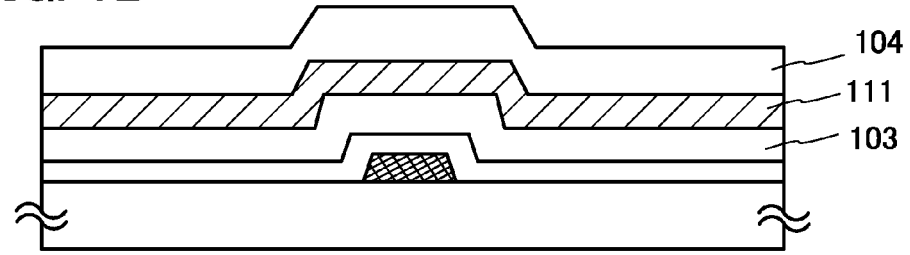
Figure 1C:
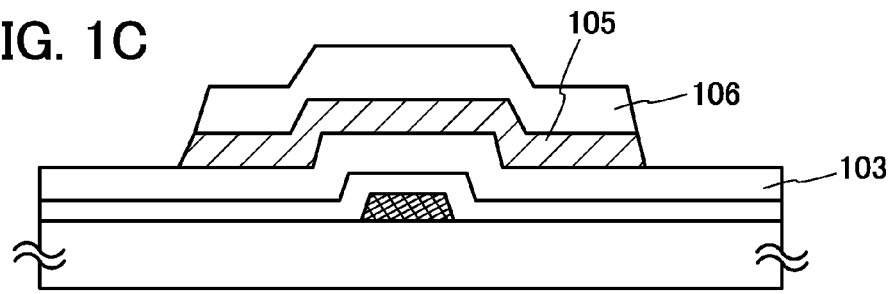
Figure 1D:
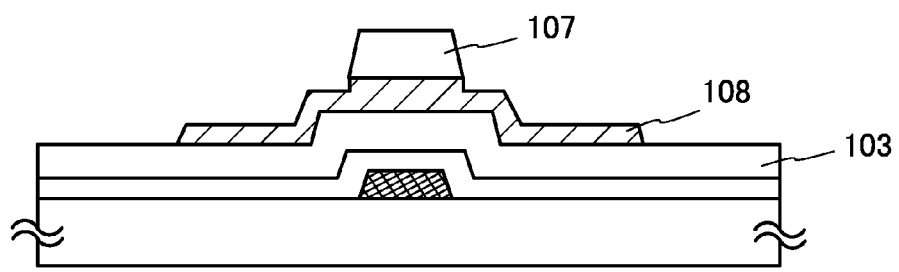
Figure 1E:
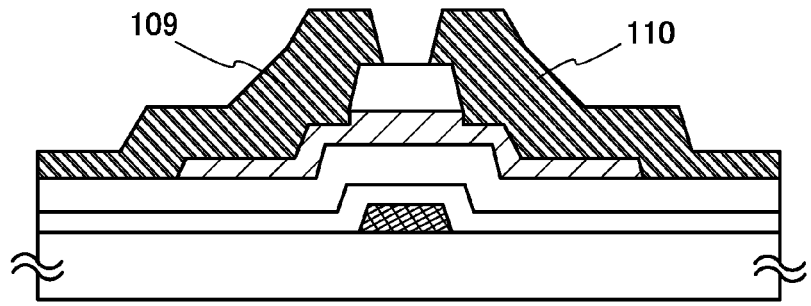

Next, the second insulating film 103 serving as the second layer of the gate insulating film, the semiconductor film 111, and the third insulating film 104 are successively formed without being exposed to air (FIG. 1B). Because the films are formed successively without being exposed to air, high productivity is obtained and the reliability of interfaces between thin films is stable. In addition, the interfaces between the films can be formed without being contaminated by atmospheric components or contaminant impurity elements in air.

Figure 2:
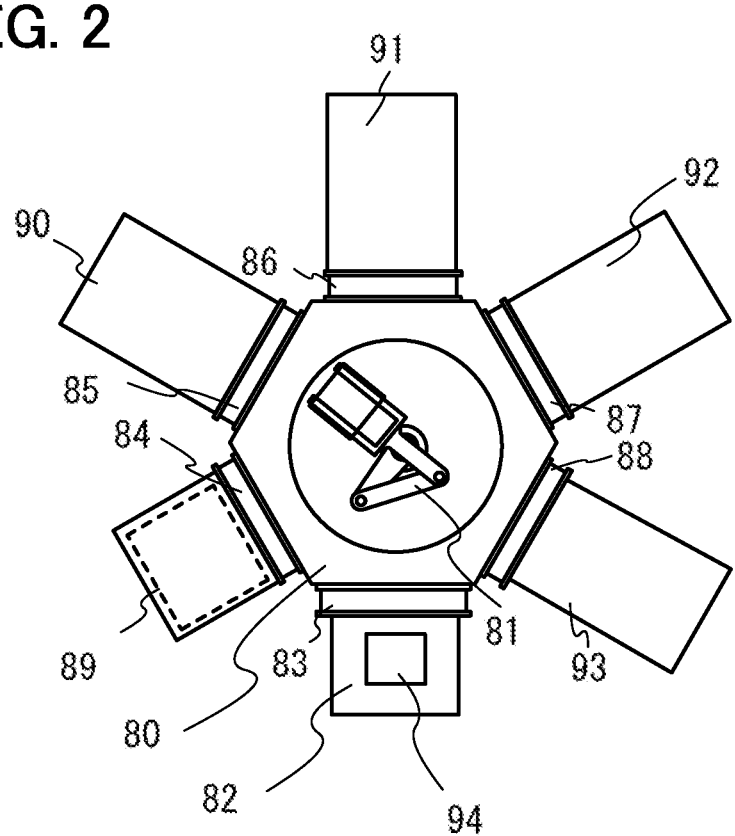
FIG. 2 is a top view illustrating a multichamber type manufacturing apparatus.

In order that the three layers are successively formed without being exposed to air, a multichamber type manufacturing apparatus illustrated in FIG. 2 is preferably used.

At the center of the manufacturing apparatus illustrated in FIG. 2, a transfer chamber 80 equipped with a transfer mechanism (typically, a transfer robot 81) for transferring a substrate is provided. A cassette chamber 82 in which a cassette case storing a plurality of substrates carried into and out of the transfer chamber 80 is set is connected to the transfer chamber 80 through a gate valve 83.

In addition, a plurality of treatment chambers are connected to the transfer chamber 80 through gate valves 84 to 88. In this embodiment, an example in which five treatment chambers are connected to the transfer chamber 80 having a hexagonal top shape is illustrated. Note that, by changing the top shape of the transfer chamber 80, the number of treatment chambers which can be connected to the transfer chamber can be changed. For example, three treatment chambers can be connected to a transfer chamber having a tetragonal shape, or seven treatment chambers can be connected to a transfer chamber having an octagonal shape.

At least one treatment chamber among the five treatment chambers is a sputtering chamber in which sputtering is performed. The sputtering chamber is provided with, at least inside the chamber, a sputtering target, a mechanism for applying electric power or a gas introduction means for sputtering the target, a substrate holder for holding a substrate at a predetermined position, and the like. Further, the sputtering chamber is provided with a pressure control means with which the pressure in the chamber is controlled, so that the pressure is reduced in the sputtering chamber.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with the use of microwaves is used without using glow discharge.

In the sputtering chamber, any of various sputtering methods described above is used as appropriate.

In addition, as a formation method, there are also a reactive sputtering method in which a target substance and a sputtering gas component are chemically reacted with each other during deposition to form a thin compound film thereof, and a bias sputtering method in which voltage is also applied to a substrate during deposition.

In addition, among the five treatment chambers, one of the other treatment chambers than the sputtering chamber is a heating chamber for preheating or the like before sputtering, a cooling chamber for cooling after sputtering, or a chamber for plasma treatment.

Next, an example of an operation of the manufacturing apparatus is described.

A substrate cassette storing a substrate 94 whose deposition target surface faces downward is set in the cassette chamber 82, and the cassette chamber 82 is placed in a reduced pressure state by a vacuum exhaust means provided in the cassette chamber 82. In each of the treatment chambers and the transfer chamber 80, the pressure is reduced in advance by a vacuum exhaust means provided in each chamber. Accordingly, during transferring the substrate between the treatment chambers, the substrate is not exposed to air and can be kept clean.

Note that at least a gate electrode is provided in advance for the substrate 94 which is placed so that its deposition target surface faces downward. For example, a base insulating film such as a silicon nitride film or a silicon nitride oxide film may also be provided by a plasma CVD method between the substrate and the gate electrode. When a substrate formed of glass containing alkali metal is used as the substrate 94, the base insulating film has an effect of preventing mobile ions of sodium or the like included in the substrate from entering a semiconductor region so that variation in electric characteristics of TFTs can be suppressed.

Here, a substrate over which a silicon nitride film covering the gate electrode is formed by a plasma CVD method as the first layer of a gate insulating film is used, and the substrate corresponds to the substrate 100 illustrated in FIG. 1A. In addition, the first layer of the gate insulating film corresponds to the first insulating film 102 illustrated in FIG. 1A. The silicon nitride film formed by a plasma CVD method is dense, so that generation of pin holes or the like can be suppressed by using this silicon nitride film as the first layer of the gate insulating film. Although this embodiment describes an example in which the gate insulating film has a stacked structure, the present invention is not limited thereto, and the gate insulating film may be a single layer or have a stacked structure including three or more layers.

Then, the gate valve 83 is opened and the substrate 94 which is the first substrate is picked up from the cassette by the transfer robot 81. After that, the gate valve 84 is opened, the substrate 94 is transferred to a first treatment chamber 89, and then, the gate valve 84 is closed. In the first treatment chamber 89, by heating the substrate 94 by a heater or a lamp, moisture or the like attached to the substrate 94 is removed. In particular, when the gate insulating film contains moisture, there is a concern that electric characteristics of TFTs might be changed; therefore, heating before sputtering is effective. In a case where moisture has been sufficiently removed at the time when the substrate is set in the cassette chamber 82, this heating treatment is not necessary.

In addition, plasma treatment may be performed on the surface of the first layer of the gate insulating film by providing a plasma treatment means in the first treatment chamber 89. Furthermore, heating for removing moisture may be performed in the cassette chamber 82 by providing a heating means in the cassette chamber 82.

Then, the gate valve 84 is opened and the substrate is transferred to the transfer chamber 80 by the transfer robot 81. After that, the gate valve 85 is opened and the substrate is transferred to a second treatment chamber 90, and the gate valve 85 is closed.

In this embodiment, the second treatment chamber 90 is a sputtering chamber in which sputtering is performed using an RF magnetron sputtering method. In the second treatment chamber 90, a silicon oxide (SiOx) film is deposited as the second layer of the gate insulating film. As the second layer of the gate insulating film, in addition to a silicon oxide film, an aluminum oxide ($Al_2O_3$) film, a magnesium oxide (MgOx) film, an aluminum nitride film (AlNx) film, an yttrium oxide (YOx) film, or the like can be used. The second layer of the gate insulating film corresponds to the second insulating film 103 illustrated in FIG. 1B.

A small amount of a halogen element such as fluorine or chlorine may be added to the second layer of the gate insulating film so as to immobilize mobile ions of sodium or the like. As a method for adding a small amount of a halogen element, sputtering is performed by introducing a gas containing a halogen element into the chamber. In the case where a gas containing a halogen element is introduced, the exhaust means of the chamber is needed to be provided with an abatement system for rendering an exhaust gas harmless. The peak of the concentration of a halogen element to be contained in the gate insulating film is measured by secondary ion mass spectrometry (SIMS) and is preferably in the range of from $1 \times 10^{15}$ $cm^{-3}$ to $1 \times 10^{20}$ $cm^{-3}$ inclusive.

When the SiOx film is formed, a sputtering method in which artificial quartz is used as a target and a rare gas, typically, argon is used, or a reactive sputtering method in which single crystal silicon is used as a target and chemically reacted with an oxygen gas to obtain a SiOx film can be used. Here, artificial quartz is used as a target, and sputtering is performed under an atmosphere including only oxygen or an atmosphere including oxygen at 90% or more and Ar at 10% or less so that as much oxygen as possible is contained in a SiOx film. Thus, a SiOx film including excessive oxygen is formed.

After the SiOx film is deposited, the gate valve 85 is opened, and the substrate is transferred to the transfer chamber 80 by the transfer robot 81 without being exposed to air. Then, the gate valve 86 is opened, the substrate is transferred to a third treatment chamber 91, and the gate valve 86 is closed.

In this embodiment, the third treatment chamber 91 is a sputtering chamber in which sputtering is performed using a DC magnetron sputtering method. In the third treatment chamber 91, an oxide metal layer (IGZO semiconductor layer) is deposited as the semiconductor film 111. In this specification, a semiconductor film formed using an oxide semiconductor including In, Ga, and Zn is also referred to as "IGZO semiconductor layer". As for the IGZO semiconductor layer, the composition ratio of the metal elements is highly flexibly set and it functions as a semiconductor layer at a wide range of mixture ratio. For example, indium oxide containing zinc oxide at 10 wt %, a material in which indium oxide, gallium oxide, and zinc oxide are mixed in equimolar ratios, and oxide containing In, Ga, and Zn at a ratio of 2.2:2.2:1.0 can be given. The IGZO semiconductor layer is preferably amorphous in order to reduce variations in electric characteristics of a thin film transistor. The IGZO semiconductor layer can be deposited using an oxide semiconductor target containing In, Ga, and Zn, under a rare gas atmosphere or an oxygen atmosphere. As the deposition conditions of the IGZO semiconductor layer, an oxide semiconductor target including In, Ga, and Zn, which is eight inches in diameter (the target in which indium oxide ($In_2O_3$), gallium oxide ($Ga_2O_3$), and zinc oxide (ZnO) are mixed in equimolar ratios and which is sintered) is used, the distance between a substrate and the target is 170 mm, the pressure is 0.4 Pa, the DC current is 0.5 kW, and the atmosphere is one including argon and oxygen. Here, an oxide semiconductor containing In, Ga, and Zn is used as a target and sputtering is performed by a pulsed DC sputtering method under an atmosphere including only oxygen or an atmosphere including oxygen at 90% or more and Ar at 10% or less so that as much oxygen as possible is contained in the IGZO semiconductor layer, whereby an IGZO semiconductor layer including excessive oxygen is formed. Sputtering is conducted to form the IGZO semiconductor layer including excessive oxygen. DC sputtering is preferable for formation of the IGZO semiconductor layer since dust can be reduced and the film thickness can be even.

As described above, the SiOx film including excessive oxygen and the IGZO semiconductor layer including excessive oxygen are formed successively without being exposed to air, whereby an interface state between the films each including excessive oxygen can be stabilized, and the reliability of a TFT can be improved. If the substrate is exposed to air before deposition of the IGZO semiconductor layer, moisture or the like is attached and the interface state is adversely affected, which may cause phenomena such as variation in threshold voltage, deterioration in electric characteristics, and a normally-on TFT. Moisture is a hydrogen compound. When the films are successively deposited without being exposed to air, the hydrogen compound can be prevented from existing at the interface. Therefore, by successive formation of the three layers, variations in threshold voltages can be reduced, deterioration of electric characteristics can be prevented, and shift to normally on of a TFT can be reduced, or preferably eliminated.

In addition, in the second treatment chamber 90 which is a sputtering chamber, both an artificial quartz target and an oxide semiconductor target containing In, Ga, and Zn are placed, and the films are successively deposited by using a shutter; therefore, the films can be stacked in the same chamber. A shutter is provided between the target and the substrate; a shutter is opened for a target which is deposited, and a target which is not deposited is shielded by a shutter. Advantages of stacking the films in the same chamber are that the number of chambers used can be decreased and attachment of particles or the like to a substrate can be prevented in transferring the substrate from a chamber to another chamber.

Next, the substrate is transferred to the transfer chamber 80 with the transferring robot 81 by opening the gate valve 86 and transferred to a fourth treatment chamber 92 by opening the gate valve 87 without being exposed to air, and then the gate valve 87 is closed.

Here, the fourth treatment chamber 92 is a sputtering chamber in which sputtering is performed using an RF magnetron sputtering method. In the fourth treatment chamber 92, a silicon oxide film ($SiO_x$ film) is deposited as a third insulating film 104 to be a channel protective film. Alternatively, for the channel protective film, an aluminum oxide film ($Al_2O_3$ film), a magnesium oxide film ($MgO_x$ film), an aluminum nitride film ($AlN_x$) film, an yttrium oxide film ($YO_x$) film, or the like may be used instead of the silicon oxide film.

A small amount of a halogen element such as fluorine or chlorine may be added to the channel protective film so as to immobilize movable ions such as sodium ions can be fixed. As a method for adding a small amount of a halogen element, sputtering is performed by introducing a gas containing a halogen element into the chamber. It is to be noted that in the case where a gas containing a halogen element is introduced, an exhaust means of the chamber is needed to be provided with an abatement system for rendering an exhaust gas harmless. The peak of the concentration of a halogen element to be contained in the channel protective film is measured by a secondary ion mass spectrometer (SIMS) and is preferably in the range of from $1 \times 10^{15}$ $cm^{-3}$ to $1 \times 10^{20}$ $cm^{-3}$.

When the $SiO_x$ film is formed for the channel protective film, a sputtering method in which artificial quartz is used as a target and a rare gas, typically, argon is used, or a reactive sputtering method in which single crystal silicon is used as a target and chemically reacted with an oxygen gas to obtain a $SiO_x$ film can be used. Here, artificial quartz is used as a target, and sputtering is performed under an atmosphere containing only oxygen, or an atmosphere containing oxygen at 90% or more and containing Ar at 10% or less so that a $SiO_x$ film contains oxygen as much as possible. Thus, the $SiO_x$ film containing an excessive amount of oxygen is formed.

By thus successively depositing the SiOx film including excessive oxygen, the IGZO semiconductor layer including excessive oxygen, and the channel protective film including excessive oxygen without being exposed to air, the interface state between the films can be stabilized because all the three layers contain excessive oxygen, and the reliability of a TFT can be improved. If the substrate is exposed to air before or after deposition of the IGZO semiconductor layer, moisture or the like is attached and the interface state is adversely affected, which may cause phenomena such as variation in threshold voltage, degradation in electric characteristics, and a normally-on TFT. Moisture is a hydrogen compound. When the films are successively deposited without being exposed to air, the hydrogen compound can be prevented from existing at the interface. Therefore, by successive formation of the three layers, variations in threshold voltages can be reduced, deterioration of electric characteristics can be prevented, and shift to normally on of a TFT can be reduced, or preferably eliminated.

In addition, in the second treatment chamber 90 which is a sputtering chamber, both an artificial quartz target and an oxide semiconductor target containing In, Ga, and Zn are placed, and the three films are successively deposited by using a shutter; therefore, the films can be stacked in the same chamber. Advantages of stacking the films in the same chamber are that the number of chambers used can be decreased and attachment of particles, moisture or the like to a substrate can be prevented in transferring the substrate from a chamber to another chamber.

In addition, three layers that are the SiOx film including excessive oxygen, the IGZO semiconductor layer including excessive oxygen, and the channel protective film including excessive oxygen are successively formed, and the layers may be transferred to the first treatment chamber 89 and the IGZO semiconductor layer may be subjected to annealing (at 300° C. to 400° C.).

After the above steps are conducted repeatedly so that a plurality of substrates in the cassette case are processed for deposition, the vacuum in the cassette chamber is released to air and the substrates and the cassette are taken out. The cross-sectional structure of the substrate at this phase corresponds to the cross-sectional view of the substrate illustrated in FIG. 1B.

Next, the third insulating film 104 is selectively etched to form an insulator 106 for pattering the semiconductor film 111, and the semiconductor film 111 is selectively etched to form the IGZO semiconductor layer 105. Dry etching or wet etching may be used, or two times of etchings may be conducted to selectively etch each of them. Note that as a method for etching the semiconductor film 111, an organic acid such as a citric acid or an oxalic acid can be used for an etchant. For example, the semiconductor film 111 with a thickness of 50 nm can be etched in 150 seconds by using the ITO07N (manufactured by Kanto Chemical Co., inc.). At this phase, in a region with the semiconductor film 111 removed, the surface of the gate insulating film is exposed. Here, a second photomask is used. The cross-sectional structure of the substrate at this phase corresponds to a cross-sectional view of the substrate illustrated in FIG. 1C.

Next, the insulator 106 is etched such that only a part of the insulator 106 that overlaps with the gate electrode, that is, the part that overlaps with a region to be channel formation region of the IGZO semiconductor layer 105 is left. A photolithography process is conducted so that selective etching is conducted to the insulator 106. At this time, a third photomask is used. Here, etching to form a channel protective film 107 is conducted under the conditions that the etching rate is sufficiently different from that of the IGZO semiconductor layer. Note that in the case where the third insulating film 104 is formed using the same material as the gate insulating film, the gate insulating film is also etched by the etching. Therefore, it is preferable to use a material different from that of the gate insulating film for the channel protective layer to prevent the gate insulating film from being etched. In this embodiment, the gate insulating film has a two-layer structure in which the second insulating film 103 as the upper layer is a $SiO_x$ film and thus might be removed and the first insulating film 102 as the lower layer is a silicon nitride film and functions as an etching stopper.

In addition, in the formation of the insulator 106, a resist mask can be formed in a position overlapping with the gate electrode by rear-face exposure in a self-alignment manner, without using a photomask. In particular, the semiconductor film 111 is an oxide semiconductor film, and has a high light-transmitting property and is suitable for rear-face exposure. Note that in the case of rear-race exposure, all of the first insulating film 102, the second insulating film 103, and the third insulating film 104 should include materials having sufficient light-transmitting properties.

Further, the IGZO semiconductor layer that is exposed is etched by about 10 nm using the channel protective film 107 as a mask. In formation of the channel protective film (the third insulating film 104) by sputtering, there is a concern that a thin mixed layer might be formed on a surface layer near the interface between the channel protective film (the third insulating film 104) and the IGZO semiconductor layer (the semiconductor film 111), and thus the mixed layer is removed by etching. By removing the mixed layer, good contact resistance can be realized, and thus variation in electric characteristics of TFTs can be reduced. By two times of etchings, the IGZO semiconductor layer is partially etched on its surface, and a thin region 108 with a thickness smaller than the region overlapping with the channel protective film 107 is formed. In the IGZO semiconductor layer, the thickness of the thin region 108 is from 2 nm to 200 nm, preferably from 20 nm to 150 nm. One time etching may be conducted to perform both formation of the channel protective film and partial etching of the surface of the IGZO semiconductor layer, instead of two times of etchings. The cross-sectional structure of the substrate at this phase corresponds to the cross-sectional view of the substrate illustrated in FIG. 1D.

Next, the substrate is set again in the cassette chamber of the multichamber type manufacturing apparatus illustrated in FIG. 2.

Next, after pressure in the cassette chamber is reduced, the substrate is transferred to the transfer chamber 80 and then to the fifth treatment chamber 93 by opening the gate valve 88.

Here, the fifth treatment chamber 93 is a sputtering chamber using a DC magnetron sputtering method. In the fifth treatment chamber 93, a metal multilayer film to be source and drain electrodes is formed. The sputtering chamber of the fifth treatment chamber 93 is provided with both a titanium target and an aluminum target and a shutter is used to perform successive formation; thus, films are formed in the same chamber. Here, an aluminum film is stacked over a titanium film and further, a titanium film is stacked over the aluminum film.

In addition, the step of etching the IGZO semiconductor layer that is exposed with the channel protective film 107 as a mask by about 10 nm thick may be conducted by reverse sputtering in the fifth treatment chamber 903, such that the IGZO semiconductor layer in the thin region 108 that is in contact with the metal multilayer film is not exposed to air. The reverse sputtering is a method by which voltage is applied to a substrate side to generate plasma on the substrate side under an argon atmosphere, an oxygen atmosphere or a nitrogen atmosphere, without applying voltage to a target side, so that a surface is etched. In this case, the phase at which the channel protective film 107 is formed is set in the cassette chamber of the manufacturing apparatus illustrated in FIG. 2. By not exposing the IGZO semiconductor layer in the thin region 108 that is in contact with the metal multilayer to air, excellent interface state between the IGZO semiconductor layer and the metal multilayer film can be realized, so that the contact resistance can be reduced.

Alternatively, the reverse sputtering is not conducted in the fifth treatment chamber, but the surface may be subjected to plasma treatment or reverse sputtering in the first treatment chamber and transferred to the fifth treatment chamber without being exposed to air after the treatment in the first treatment chamber and the metal multilayer film is formed in the fifth treatment chamber.

Further, heat treatment, specifically, heat treatment at from 300° C. to 400° C., preferably, heat treatment at 350° C. or higher can be performed in the first treatment chamber 89 after deposition of the IGZO film including excessive oxygen. By such heat treatment, electric characteristics of an inverted staggered thin film transistor can be improved. Timing of the heat treatment is not limited to a particular timing as long as the heat treatment is performed after deposition of the IGZO film including excessive oxygen. For example, the heat treatment can be performed right after deposition of the IGZO film including excessive oxygen or right after deposition of the metal multi-layer film. In this case, heat treatment is conducted at 350° C. for one hour after the metal multilayer film is formed.

After the above steps are repeated so that a plurality of substrates in the cassette case are processed for deposition, the vacuum in the cassette chamber is released to air and the substrates and the cassette are taken out.

Next, the metal multilayer film is selectively etched to form a source electrode 109 or a drain electrode 110. In this etching, the channel protective film 107 functions as an etching stopper. Here, a fourth photomask is used. Note that a conductive film having a three-layer film in which a titanium film, an aluminum film, and a titanium film are sequentially stacked can be etched by using a hydrogen peroxide solution or a heated hydrochloric acid as an etchant. The cross-sectional structure of the substrate at this phase corresponds to the cross-sectional view of the substrate illustrated in FIG. 1E.

In this embodiment, a multichamber type manufacturing apparatus is described as an example, but an in-line type manufacturing apparatus in which sputtering chambers are connected in series may be used and successive formation may be performed without being exposed to air. In the case of using the in-line type manufacturing apparatus, a substrate which is vertically placed can be transferred and set vertically in a sputtering chamber.

The apparatus illustrated in FIG. 2 has a so-called face-down treatment chamber in which the deposition target surface of the substrate faces downward, but may also have a vertical placement treatment chamber in which a substrate is placed vertically. The vertical placement treatment chamber has an advantage that a footprint is smaller than that of a face-down treatment chamber and can be effectively used in the case where a large-area substrate which might sags under its weight is used.

Embodiment 2

In Embodiment 2, a case where the thin film transistor obtained in Embodiment 1 is used as a switching element of a display device is described as an example.

Figure 3:
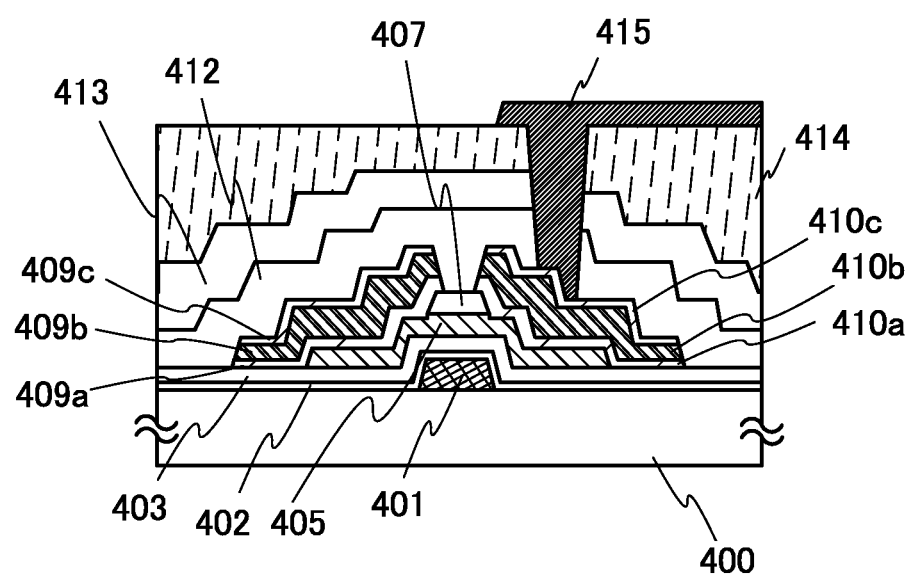
FIG. 3 illustrates an example of a cross-sectional structure of a thin film transistor.

FIG. 3 is a cross-sectional view of a substrate used for a display device. Note that the structure of the thin film transistor has been described in Embodiment 1, and thus detailed description thereof is omitted here.

The thin film transistor includes a gate electrode 401 over a substrate 400, and a first insulating film 402 and a second insulating film 403 to cover the gate electrode 401, as illustrated in FIG. 3. In addition, a channel protective film 407 is in contact with a part of an IGZO semiconductor layer 405, and is arranged over the gate electrode 401 to overlap therewith. In addition, the IGZO semiconductor layer 405 is provided between the channel protective film 407 and the gate electrode 401.

In addition, as described in Embodiment 1, the metal multilayer films each have a three-layer structure in which aluminum films 409b and 410b are stacked over first titanium films 409a and 410a, and second titanium films 409c and 410c are stacked over the aluminum films 409b and 410b. Each of the metal multilayer films serves as a source electrode or a drain electrode.

The first titanium films 409a and 410a can each have an excellent interface with the IGZO semiconductor layer so that contact resistance is low. Further, the aluminum films can realize low-resistant wirings.

The second titanium films 409c and 410c can effectively prevent hillocks of the aluminum films.

In this case, the thin film transistor obtained in Embodiment 1 is covered with a protective film or a planarization insulating film in order to reduce surface unevenness of the thin film transistor and enhance reliability of the thin film transistor. Note that the protective film is provided to prevent entry of a contaminant impurity such as an organic substance, a metal substance or moisture in the atmosphere and is preferably a dense film. The protective film may be formed with a single layer or a multilayer of a silicon oxide film, a silicon nitride film, a silicon oxynitride film and/or a silicon nitride oxide film formed by a CVD method or the like. In addition, as the protective film, a silicon oxide film may be formed by a plasma CVD method using an organosilane gas and oxygen as a process gas.

As examples of the organosilane, the following compounds can be given: tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like.

A fourth insulating film 412 is formed as the first layer of the protective film. The fourth insulating film 412 can effectively prevent hillocks of the aluminum film. In this case, a silicon oxide film is formed by a plasma CVD method as the fourth insulating film 412. For a process gas for forming the silicon oxide film, TEOS and $O_2$ are used. For example, the flow of TEOS and $O_2$ are 15 (sccm) and 750 (sccm), respectively. The substrate temperature at the deposition step is 300° C.

Further, a fifth insulating film 413 is formed as the second layer of the protective film. In this case, as the fifth protective film 413, a silicon nitride film is formed by a plasma CVD method. As a process gas for formation of the silicon nitride film, $SiH_4$, $N_2$, $NH_3$ and $H_2$ are used. The use of the silicon nitride film as one layer of the protective film can prevent mobile ions of sodium or the like from entering a semiconductor region so that variation in electric characteristics of TFTs can be suppressed.

Additionally, the IGZO semiconductor layer may be annealed (at 300° C. to 400° C.) after the protective film is formed.

Moreover, a sixth insulating film 414 is formed as the planarization insulating film. As the sixth insulating film 414, an organic material having heat resistance, such as acrylic, polyimide, benzocyclobutene, polyamide, or epoxy, can be used. In addition to such organic materials, it is also possible to use a low-dielectric constant material (a low-k material), a siloxane resin, PSG (phosphosilicate glass), BPSG (borophosphosilicate glass), or the like. A siloxane-based resin may include as a substituent at least one of fluorine, an alkyl group, and an aryl group, as well as hydrogen. Note that the sixth insulating film 414 may be formed by stacking a plurality of insulating films formed using materials.

Note that a siloxane resin is a resin formed from a siloxane material as a starting material and having the bond of Si—O—Si. The siloxane-based resin may include as a substituent at least one of fluorine, an alkyl group, and aromatic hydrocarbon, as well as hydrogen.

The sixth interlayer insulating film 414 can be formed by a method such as CVD, sputtering, SOG, spin coating, dipping, spray coating, droplet discharging (ink jetting, screen printing, offset printing, or the like), a doctor knife, a roll coater, a curtain coater, or a knife coater, depending on the material thereof. When the sixth insulating film 414 is formed using a material liquid, the IGZO semiconductor layer may be annealed (at 300° C. to 400° C.) at the same time as a baking process for the sixth insulating film 414. The baking process of the sixth insulating film 414 serves also as the annealing process of the IGZO semiconductor layer, and thereby a display device can be manufactured efficiently.

Next, for formation of a contact hole that reaches the second titanium film 410c, a resist mask is formed by a photolithography process. At this time, a fifth photomask is used. Selective etching is conducted using the resist mask as a mask to form the contact hole that reaches the second titanium film 410c. Note that a contact hole that reaches the gate electrode 401 is formed using the same photomask.

Then, a conductive film that is electrically connected to the second titanium film 410c is formed. The conductive film is selectively etched by a photolithography process to form a conductive layer 415. At this time, a sixth photomask is used. The conductive layer 415 is used as a pixel electrode or a connection electrode. The pixel electrode is electrically connected to the second titanium film 410c. In addition, the connection electrode is electrically connected to the gate electrode 401.

The substrate obtained through the above steps can be used for a wide variety of types of display devices.

In a case where a transmissive type liquid crystal display device is manufactured, the conductive layer 415 serves as a pixel electrode, and can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Further, in a case where a transparent conductive film such as an ITO film is used as the pixel electrode, the transparent conductive film can have an excellent interface with the second titanium film 409c or the second titanium film 410c, so that the contact resistance is low.

Furthermore, the pixel electrode can be formed using a conductive composition containing a conductive high-molecular material (also referred to as a "conductive polymer"). The pixel electrode formed from the conductive composition has preferably a sheet resistance of 10000 Ω/square or less and a transmittance of 70% or more at a wavelength of 550 nm. Further, the resistivity of the conductive polymer included in the conductive composition is preferably 0.1 Ω·cm or lower.

As the conductive polymer, a so-called π-electron conjugated conductive polymer can be used. As examples thereof, polyaniline or a derivative thereof, polypyrrole or a derivative thereof, polythiophene or a derivative thereof, a copolymer of more than two kinds of them, and the like can be given.

In addition, in a case where a transmissive type liquid crystal display device is manufactured, the pixel electrode corresponds to a display region, and a stacked layer located in the display region should transmit light sufficiently, and thus the first insulating film or the second insulating film located in the display region may be partially removed.

Meanwhile, in a case where a reflective type liquid crystal display device is manufactured, a pixel electrode is formed using a conductive material having reflectivity, for example, a conductive film formed from titanium, tungsten, nickel, gold, platinum, silver, copper, tantalum, molybdenum, aluminum, magnesium, calcium, lithium, or an alloy thereof.

Moreover, in a case where an EL display device is manufactured, a material of a pixel electrode should be selected in consideration of its work function. In this embodiment, the thin film transistor is an n-channel thin film transistor, and thus the conductive layer 415 preferably serves as a cathode, and a material having a low work function (typically, a material having a work function of 3.5 eV or less) is preferable. However, with use of an EL layer formed over the conductive layer 415, typically, an organic compound layer having an excellent hole-injecting or hole-transporting property, or an organic compound layer having an excellent electron-injecting or electron-transporting property, the conductive layer 415 can be formed using any of a variety of materials without particular limitations on its work function.

In addition, in a case where an electrophoretic display device is manufactured, a pixel electrode can be formed with any conductive film that has low electric resistance, without particular limitations.

This embodiment can be freely combined with Embodiment 1.

Embodiment 3

In a case where a thin film transistor is used as a switching element of a display device, it is important to reduce leakage current in an off state. In Embodiment 3, an example of a structure of a thin film transistor whose leakage current amount in an off state is reduced is described.

In Embodiment 1, the single gate structure is exemplified, but in Embodiment 3, a multigate thin film transistor that can reduce more leakage current amount in its off state is exemplified.

Figure 4A:
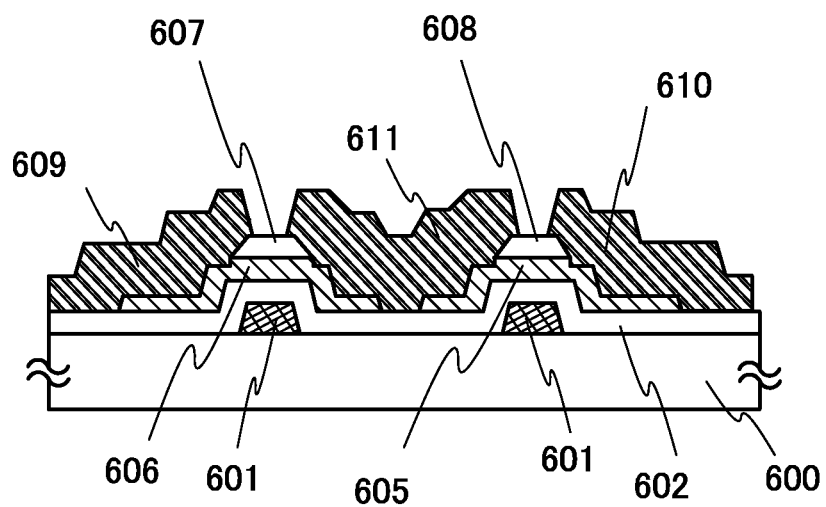
FIGS. 4A and 4B each illustrate an example of a cross-sectional structure of a thin film transistor.

The multigate thin film transistor includes a plurality of channel formation regions. FIG. 4A illustrates an example of a double-gate type thin film transistor.

Embodiment 3 is different only in layout from Embodiment 1, and thus the manufacturing method of the double-gate type thin film transistor is not described here in detail.

FIG. 4A illustrates an example of a double-gate type thin film transistor using two IGZO semiconductor layers formed over a substrate 600, and the thin film transistor includes a first channel formation region 605 that overlaps with and is in contact with a first channel protective film 608 and a second channel formation region 606 that overlaps with and is in contact with a second channel protective film 607.

The first channel formation region 605 overlaps with a gate electrode 601 with a gate insulating film 602 therebetween. In addition, the second channel formation region 606 overlaps with the gate electrode 601 with the gate insulating film 602 therebetween.

Further, the thickness of regions of the IGZO semiconductor layers, which are in contact with source or drain electrodes 609, 610 is made smaller than that of the first channel formation region 605 and the second channel formation region 606.

A connection electrode 611 that is in contact with both of the first channel protective film 608 and the second channel protective film 607 is formed over the IGZO semiconductor layers. The connection electrode 611 is formed in the same process as the source or drain electrodes 609, 610. The connection electrode 611 is a floating electrode. Note that end portions of the two IGZO semiconductor layers are located between the two gate electrode 601, and the connection electrode 611 is in contact with part of the gate insulating film 602.

In addition, the thickness of regions of the IGZO semiconductor layers that are in contact with the connection electrode 611 is smaller than the thickness of the first channel formation region 605 and the second channel formation region 606.

The structure illustrated in FIG. 4A can realize reduction of leakage current in an off state. By reduction of leakage current in an off state, power consumption of a display device can be reduced.

Figure 4B:
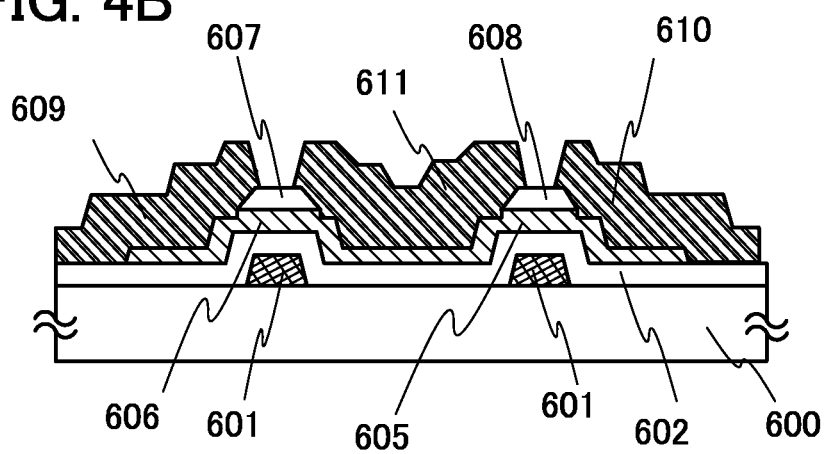

FIG. 4B illustrates a cross-section of a double-gate type thin film transistor which is partially different from that in FIG. 4A. FIG. 4B illustrates an example of the double-gate type thin film transistor using one IGZO semiconductor layer formed over the substrate 600. The thin film transistor illustrated in FIG. 4B is different from that in FIG. 4A only in that the end portions of the IGZO semiconductor layer do not exist between the two gate electrodes 601. The other portions of FIG. 4B are the same as those of FIG. 4A, and thus are denoted by the same numerals as those used in FIG. 4A. The thin film transistor of FIG. 4A and the thin film transistor of FIG. 4B have substantially the same electric characteristics.

This embodiment can be freely combined with Embodiment 1 or Embodiment 2.

Embodiment 4

In an example of Embodiment 4 to be described below, at least a part of a driver circuit and a thin film transistor to be disposed in a pixel portion are formed over one substrate.

The thin film transistor to be disposed in the pixel portion is formed according to any one of Embodiments 1 to 3. Further, the thin film transistor described in any one of Embodiments 1 to 3 is an n-channel TFT, and thus a part of a driver circuit that can include an n-channel TFT among driver circuits is formed over the same substrate as the thin film transistor of the pixel portion.

Figure 5A:
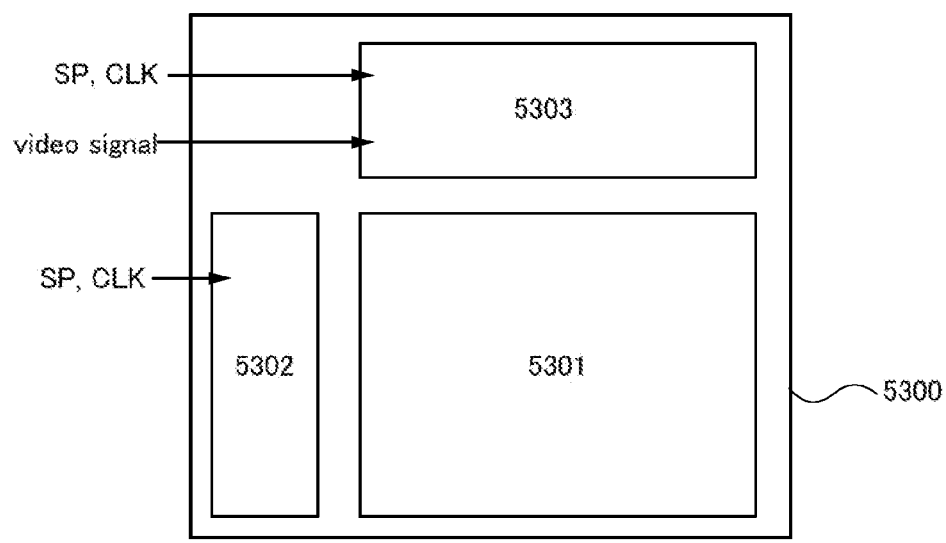
FIGS. 5A and 5B are block diagrams of display devices.

FIG. 5A illustrates an example of a block diagram of an active matrix liquid crystal display device. The display device illustrated in FIG. 5A includes, over a substrate 5300, a pixel portion 5301 including a plurality of pixels that are provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor described in any one of Embodiments 1 to 3 is an n-channel TFT, and a signal line driver circuit including the n-channel TFT is described with reference to FIG. 6.

Figure 6:
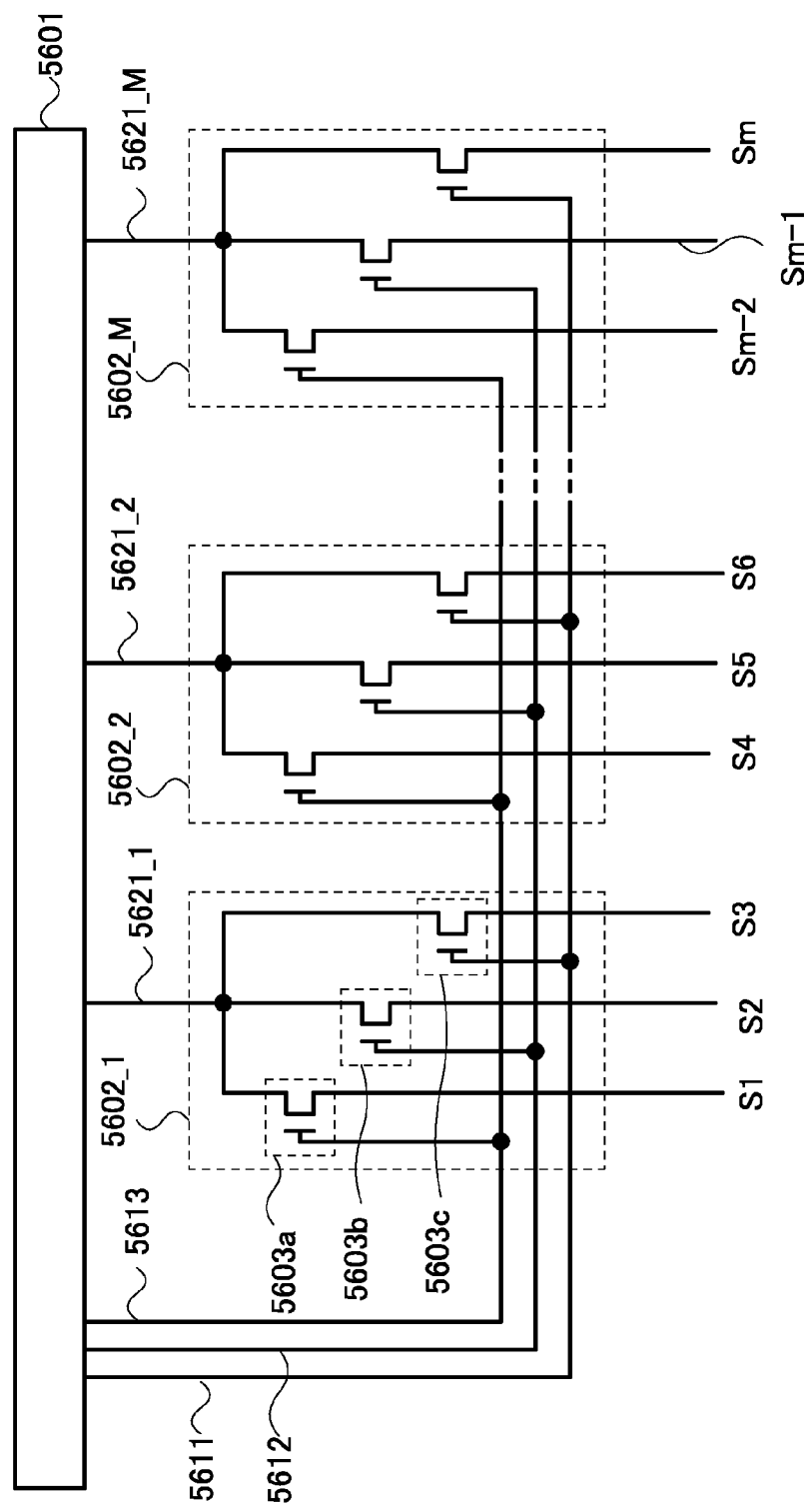
FIG. 6 illustrates a structure of a signal line driver circuit.

The signal line driver circuit illustrated in FIG. 6 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the switch groups 5602_1 to 5602_M are connected to the wirings 5621_1 to 5621_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c included in the switch group 5602_J.

A signal is input to each of the first wiring 5611, the second wiring 5612, and the third wiring 5613.

Note that the driver IC 5601 is preferably formed over a single crystalline substrate. The switch groups 5602_1 to 5602_M are preferably formed over the same substrate as thin film transistors in the pixel portion illustrated in any one of Embodiments 1 to 3. Therefore, the driver IC 5601 and the switch groups 5602_1 to 5602_M are preferably connected through an FPC or the like.

Figure 7:
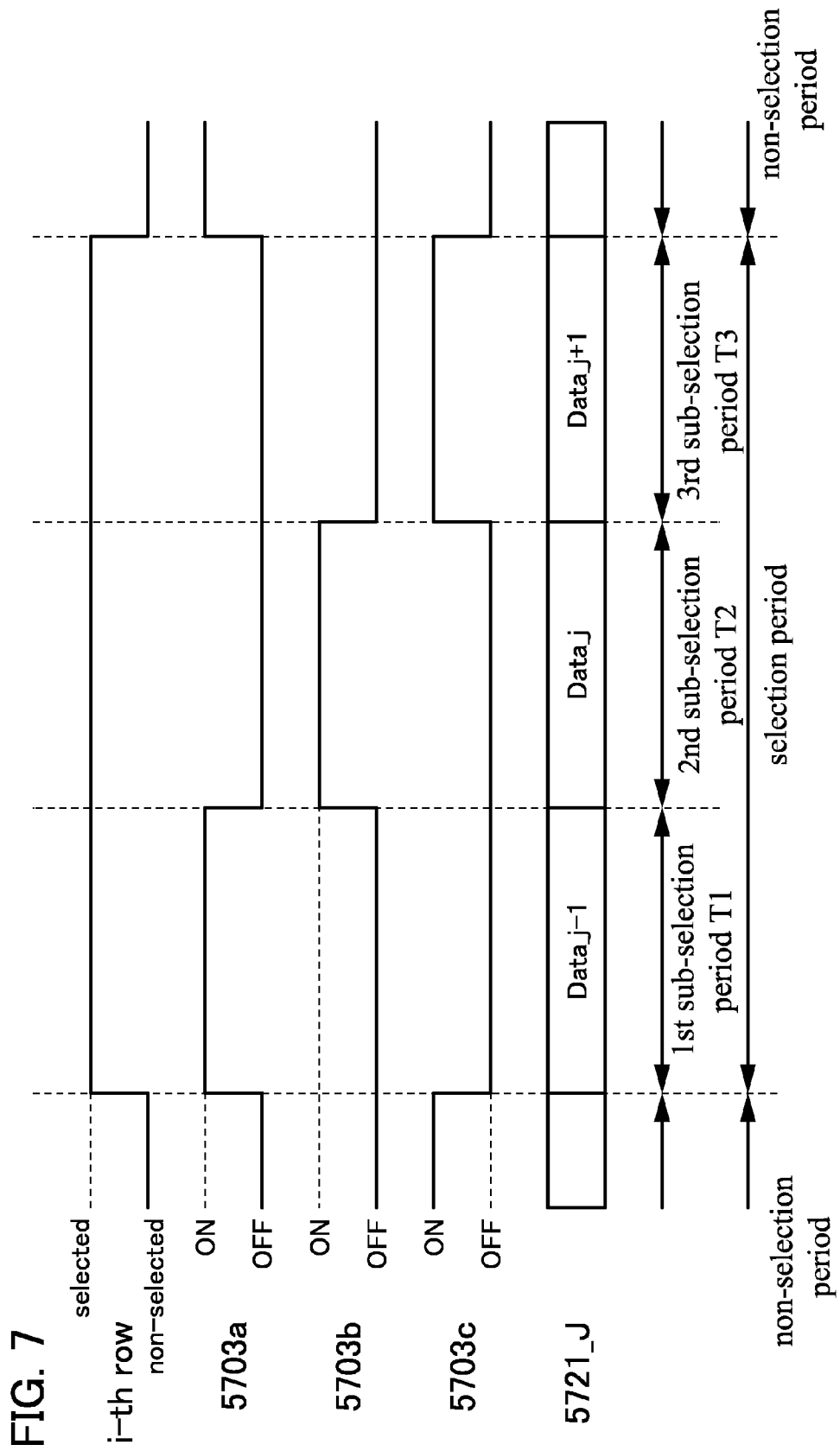
FIG. 7 is a timing chart illustrating operation of a signal line driver circuit.

Next, operation of the signal line driver circuit illustrated in FIG. 6 is described with reference to a timing chart in FIG. 7. The timing chart in FIG. 7 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 6 operates as in FIG. 7 even when a scan line of another row is selected.

Note that the timing chart in FIG. 7 shows a case where the wiring 5621_J in the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 7 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1.

As illustrated in FIG. 7, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor

5603b are turned off. At this time, Data_j+1 input to the wiring 5621_J is input to the signal line Sj+1 via the third thin film transistor 5603c.

As described above, in the signal line driver circuit in FIG. 6, by dividing one gate selection period into three, video signals can be input to three signal lines from one wiring 5621 in one gate selection period. Therefore, in the signal line driver circuit in FIG. 6, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 6 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective the sub-selection periods as illustrated in FIG. 6.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 8:
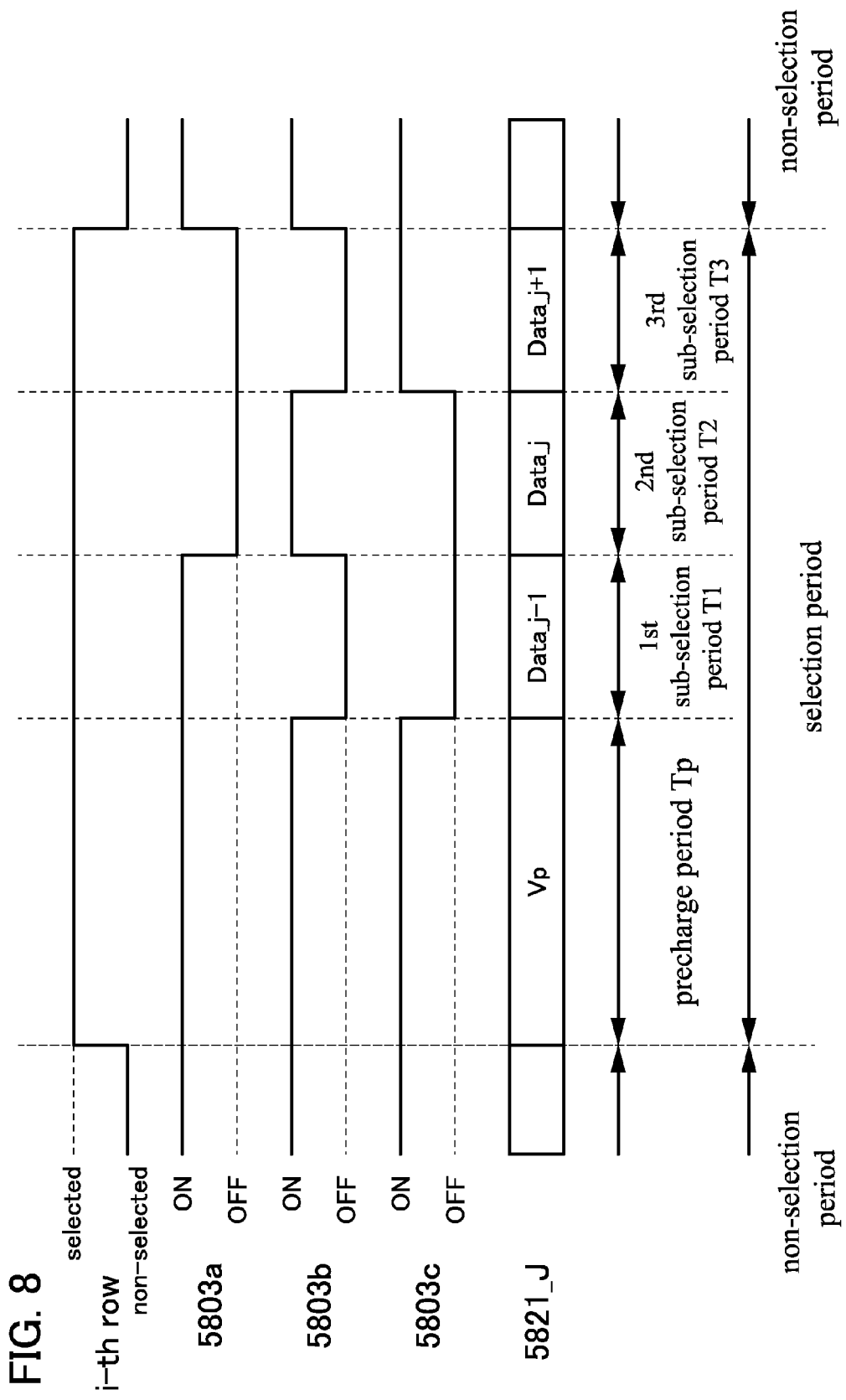
FIG. 8 is a timing chart illustrating operation of a signal line driver circuit.

As another example, one gate selection period may be divided into a precharge period Tp, the first sub-selection period T1, the second sub-selection period T2, and the third sub-selection period T3 as illustrated in a timing chart in FIG. 8. The timing chart in FIG. 8 illustrates timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 8, the first thin film transistor 5603a, the second thin film transistor 5603b, and the third thin film transistor 5603c are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 6 to which the timing chart in FIG. 8 is applied, the video signal can be written to the pixel at high speed because the signal line can be precharged by providing a precharge selection period before a sub-selection period. Note that portions in FIG. 8 which are similar to those of FIG. 7 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large current can be used.

One mode of a shift register which is used for a part of a scan line driver circuit is described with reference to FIG. 9 and FIG. 10.

Figure 9:
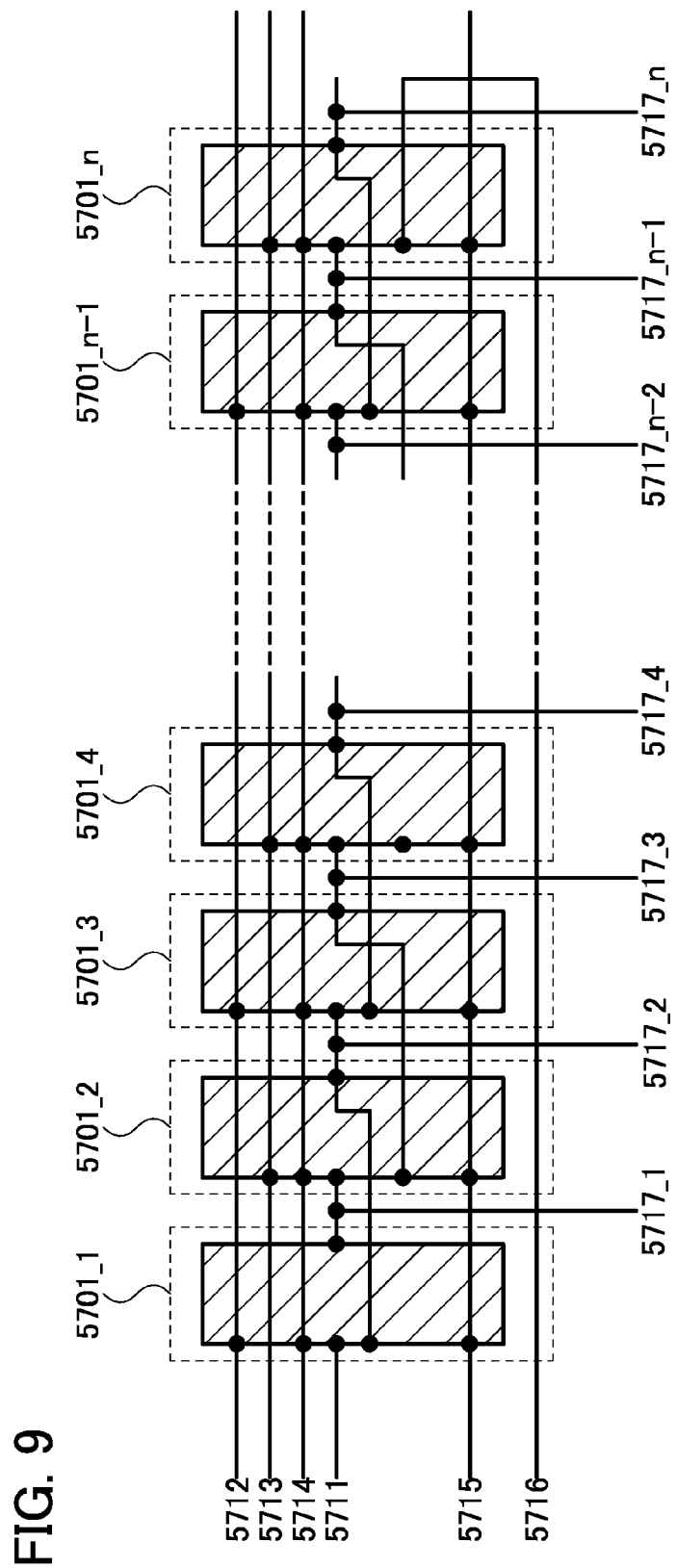
FIG. 9 illustrates a structure of a shift register.

FIG. 9 illustrates a circuit configuration of the shift register. The shift register illustrated in FIG. 9 includes a plurality of flip-flops (flip-flops 5701-1 to 5701-n). The shift register is operated with input of a first clock signal, a second clock signal, a start pulse signal, and a reset signal.

Connection relations of the shift register in FIG. 9 are described. In the i-th stage flip-flop 5701_i (one of the flip-flops 5701-1 to 5701_n) in the shift register of FIG. 9, a first wiring 5501 illustrated in FIG. 10 is connected to a seventh wiring 5717_i−1; a second wiring 5502 illustrated in FIG. 10 is connected to a seventh wiring 5717_i+1; a third wiring 5503 illustrated in FIG. 10 is connected to a seventh wiring 5717_i; and a sixth wiring 5506 illustrated in FIG. 10 is connected to a fifth wiring 5715.

Figure 10:
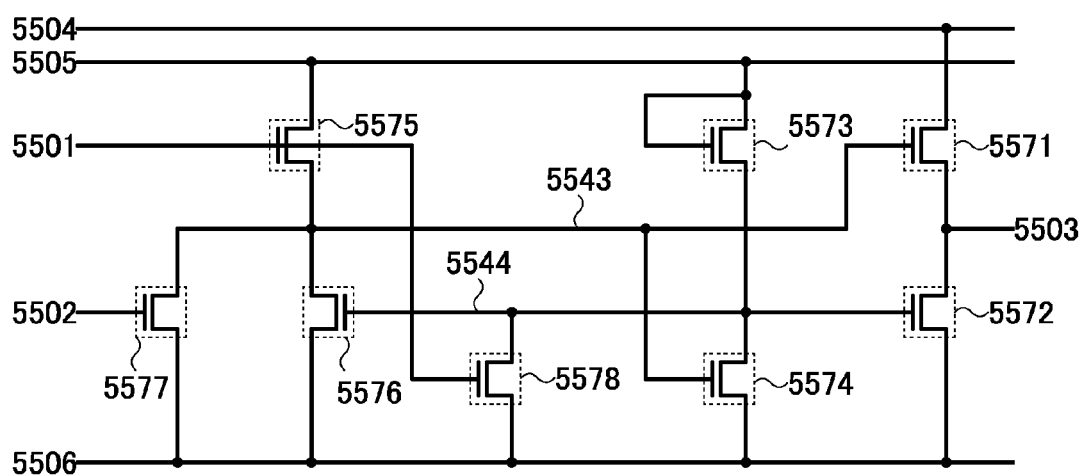
FIG. 10 illustrates connection in the flip flop illustrated in FIG. 9.

Further, a fourth wiring 5504 illustrated in FIG. 10 is connected to a second wiring 5712 in flip-flops of odd-numbered stages, and is connected to a third wiring 5713 in flip-flops of even-numbered stages. A fifth wiring 5505 illustrated in FIG. 10 is connected to a fourth wiring 5714.

Note that the first wiring 5501 of the first stage flip-flop 5701_1 illustrated in FIG. 10 is connected to a first wiring 5711. Moreover, the second wiring 5502 of the n-th stage flip-flop 5701_n illustrated in FIG. 10 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Next, FIG. 10 illustrates details of the flip-flop illustrated in FIG. 9. A flip-flop illustrated in FIG. 10 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, the connection structure of the flip-flop illustrated in FIG. 9 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

In addition, the signal line driver circuit and the scan line driver circuit can be formed using only the n-channel TFTs described in any one of Embodiments 1 to 3. The n-channel TFT described in any one of Embodiments 1 to 3 has a high mobility in the transistor characteristics, and thus a driving frequency of a driver circuit can be increased. For example, a scan line driver circuit using the n-channel TFT described in any one of Embodiments 1 to 3 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized.

Figure 5B:
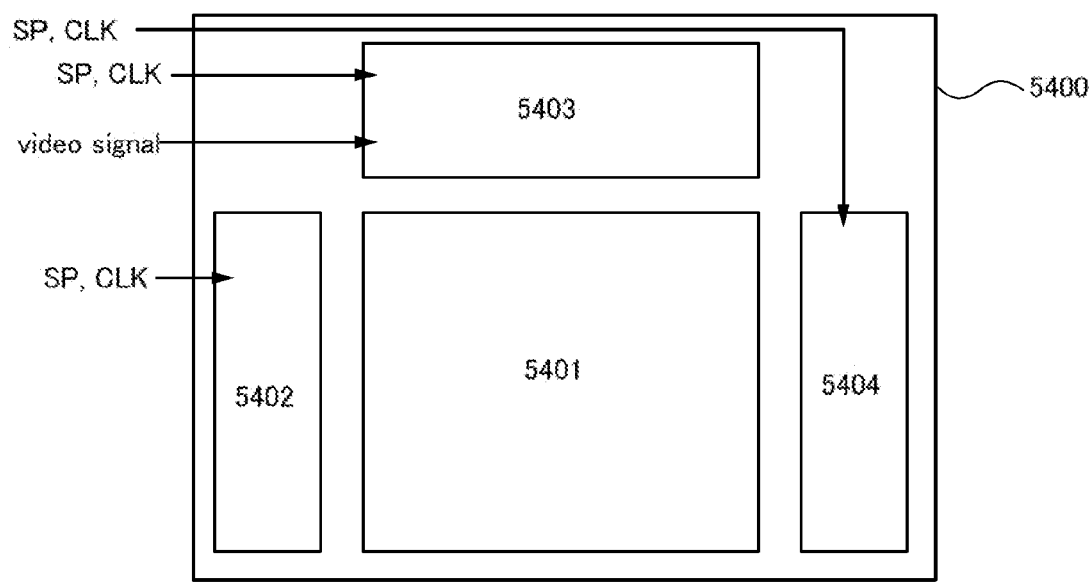

Further, when an active matrix light-emitting display device is manufactured, a plurality of transistors are arranged in at least one pixel, and thus a plurality of scan line driver circuits are preferably arranged. FIG. 5B is a block diagram illustrating an example of an active matrix light-emitting display device.

The display device illustrated in FIG. 5B includes, over a substrate 5400, a pixel portion 5401 having a plurality of pixels provided with a display element, a first scan line driver circuit 5402 and a second scan line driver circuit 5404 that select a pixel, and a signal line driver circuit 5403 that controls input of a video signal to the selected pixel.

When the video signal input to a pixel of the display device illustrated in FIG. 5B is a digital signal, a pixel emits light or does not emit light by switching of ON/Off of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of displaying with a time gray scale method, one frame period is divided into a plurality of subframe periods. Then, in accordance with video signals, the light-emitting element in the pixel is set in a light-emitting state or a non-light-emitting state in each subframe period. By dividing one frame into a plurality of subframes, the total length of time, in which pixels actually emit light in one frame period, can be controlled with video signals so that gray scales are displayed.

In the example of the light-emitting device illustrated in FIG. 5B, in a case where two TFTs of a switching TFT and a current control TFT are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

In addition, also in the light-emitting device, a part of the driver circuit(s) that can include n-channel TFTs among driver circuits can be formed over the same substrate as the thin film transistors of the pixel portions. Alternatively, the signal line driver circuit and the scan line driver circuit can be formed using only the n-channel TFTs described in Embodiment 1 or 2.

Moreover, the above-described driver circuit can be used for electronic paper that drives electronic ink using an element electrically connected to a switching element, without being limited to applications to a liquid crystal display device or a light-emitting device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positive-charged and second particles which are negative-charged. By applying an electric field to the microcapsules, the particles in the microcapsules are moved in opposite directions and only the color of the particles concentrated on one side is exhibited. It is to be noted that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant move to a high-electric field region. An electrophoretic display does not need to use a polarizer and a counter substrate, which are required in a liquid crystal display device, and both the thickness and weight of the electrophoretic display device can be a half of those of a liquid crystal display device.

A solution in which the aforementioned microcapsules are dispersed in a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the substrate obtained in Embodiment 2 can be used.

It is to be noted that the first particles and the second particles in the microcapsules may each be formed of a single material selected from a conductive material, an insulator material, a semiconductor material, a magnetic material, a liquid crystal material, a ferroelectric material, an electroluminescent material, an electrochromic material, or a magnetophoretic material or formed of a composite material of any of these.

This embodiment can be freely combined with any one of Embodiments 1 to 3.

Embodiment 5

A thin film transistor of one embodiment of the present invention is manufactured, and a display device having a display function can be manufactured using the thin film transistor for a pixel portion and further for a driver circuit. Further, part or whole of a driver circuit can be formed over the same substrate as a pixel portion, using a thin film transistor of one embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. One embodiment of the present invention relates to one mode of an element substrate before the display element is completed in a manufacturing process of the display device, and the element substrate is provided with means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that the term "display device" in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device will be described as an example of a semiconductor device of one embodiment of the present invention.

Figure 11A:
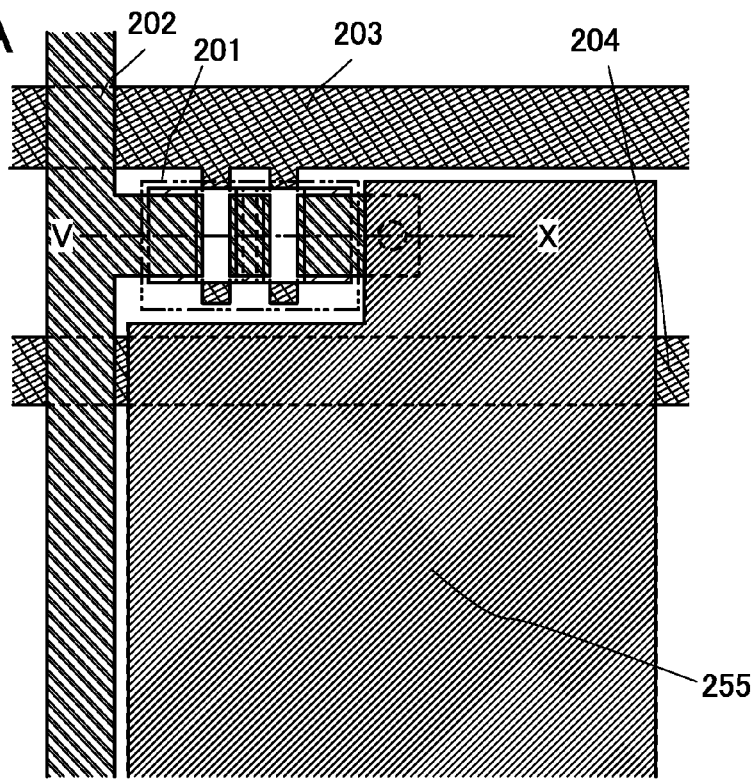
FIGS. 11A and 11B are a top view and a cross-sectional view of a pixel of a liquid crystal display device respectively.
Figure 11B:
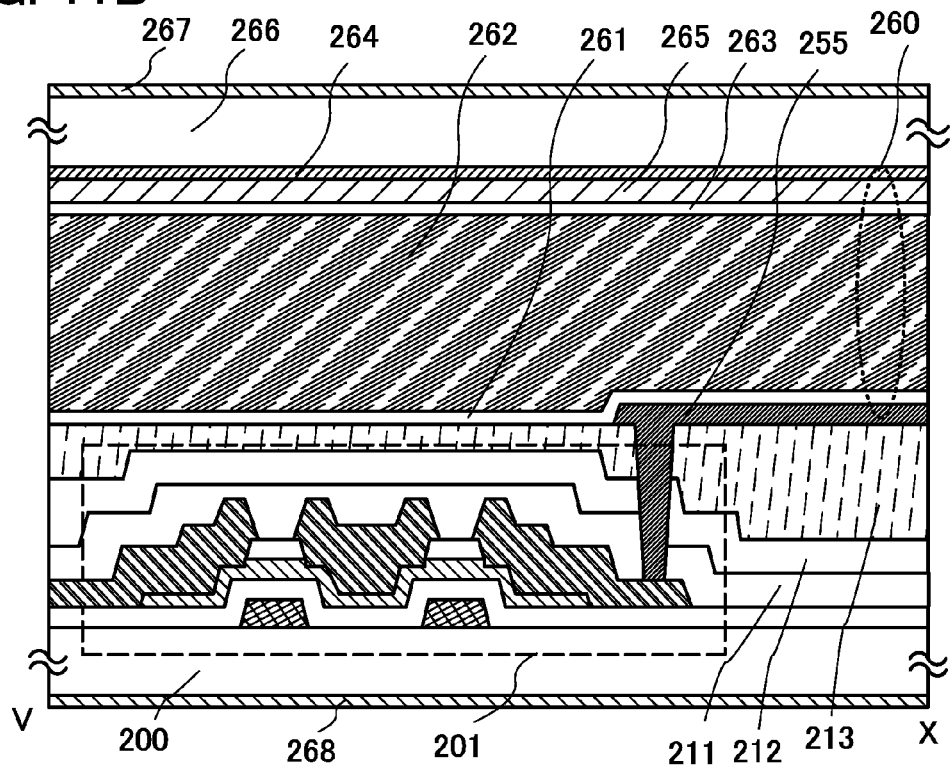

FIGS. 11A and 11B illustrate an active-matrix liquid crystal display device to which one embodiment of the present invention is applied. FIG. 11A is a plan view of the liquid crystal display device. FIG. 11B is a cross-sectional view taken along line V-X of FIG. 11A. A thin film transistor 201 used in the semiconductor device can be manufactured in a manner similar to the thin film transistor described in Embodiment 1 and is a highly reliable thin film transistor formed at reduced cost by successive deposition using a sputtering method. Any of the thin film transistors described in Embodiments 2 and 3 can also be used as the thin film transistor 201 of this embodiment.

The liquid crystal display device of this embodiment illustrated in FIG. 11A includes a source wiring layer 202, a thin film transistor 201 with a multi-gate structure, a gate wiring layer 203, and a capacitor wiring layer 204.

Further, in FIG. 11B, in the liquid crystal display device of this embodiment, a substrate 200 provided with the thin film transistor 201 with a multi-gate structure, an insulating layer 211, an insulating layer 212, an insulating layer 213, an electrode layer 255 used for a display element, an insulating layer 261 serving as an alignment film, and a polarizing plate 268 and a substrate 266 provided with an insulating layer 263 serving as an alignment film, an electrode layer 265 used for a display element, a coloring layer 264 serving as a color filter, and a polarizing plate 267 face to each other with a liquid crystal layer 262 interposed therebetween; thus, a liquid crystal display element 260 is formed.

Alternatively, as the liquid crystal layer 262, liquid crystal showing a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition in which a chiral agent at 5 wt % or more is mixed is used for the liquid crystal layer 262 in order to improve the temperature range. The liquid crystal composition which includes liquid crystal showing a blue phase and a chiral agent have such characteristics that the response time is as short as 10 μs to 100 μs, the alignment process is unnecessary because the liquid crystal composition has optical isotropy, and viewing angle dependency is small.

While FIGS. 11A and 11B illustrate an example of the liquid crystal display device in which the polarizing plate 267 is provided in a position outer than the substrate 266 (on the viewer side) and the coloring layer 264 and the electrode layer 265 used for a display element are provided in a position inner than the substrate 266 in that order, the polarizing plate 267 may be provided in an inner position than the substrate 266. The stacked structure of the polarizing plate and the coloring layer is not limited to that shown in FIG. 11B and may be set as appropriate depending on materials of the polarizing plate and the coloring layer or conditions of a manufacturing process. Further, a light-blocking film serving as a black matrix may be provided.

The electrode layers 255 and 265 each serving as a pixel electrode layer can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

Through this process, a highly reliable liquid crystal display device as a semiconductor device can be manufactured.

This embodiment can be combined with any structure described in the other embodiments, as appropriate.

Embodiment 6

In Embodiment 6, an example of electronic paper will be described as a semiconductor device according to one embodiment of the present invention.

Figure 12:
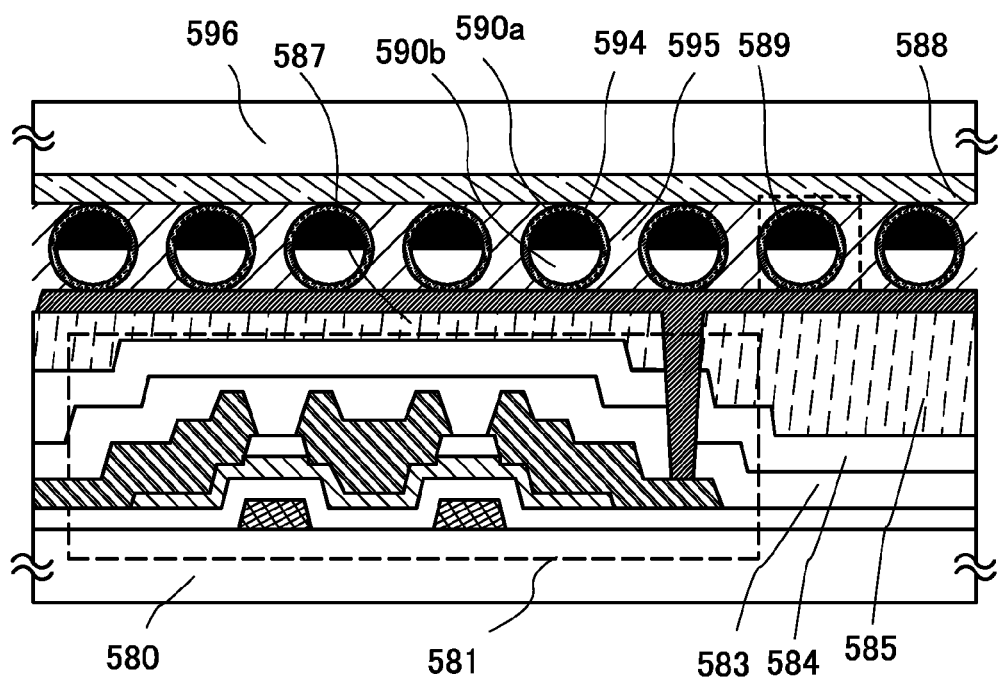
FIG. 12 is a cross-sectional view of electronic paper.

FIG. 12 illustrates active matrix electronic paper as an example of a semiconductor device to which one embodiment of the present invention is applied. A thin film transistor 581 used for the semiconductor device can be manufactured in a manner similar to the thin film transistor described in Embodiment 1 and is a highly reliable thin film transistor formed at reduced cost by successive deposition using a sputtering method. Any of the thin film transistors described in Embodiments 2 and 3 can also be used as the thin film transistor 201 of this embodiment.

The electronic paper in FIG. 12 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is an inverted staggered thin film transistor with a multi-gate structure, and a source electrode and a drain electrode thereof is in contact with a first electrode layer 587 at an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 12).

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper as a semiconductor device can be manufactured.

This embodiment can be combined with the structure described in other embodiments, as appropriate.

Embodiment 7

In this embodiment, an example of a light-emitting display device will be described as a semiconductor device according one embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 13A:
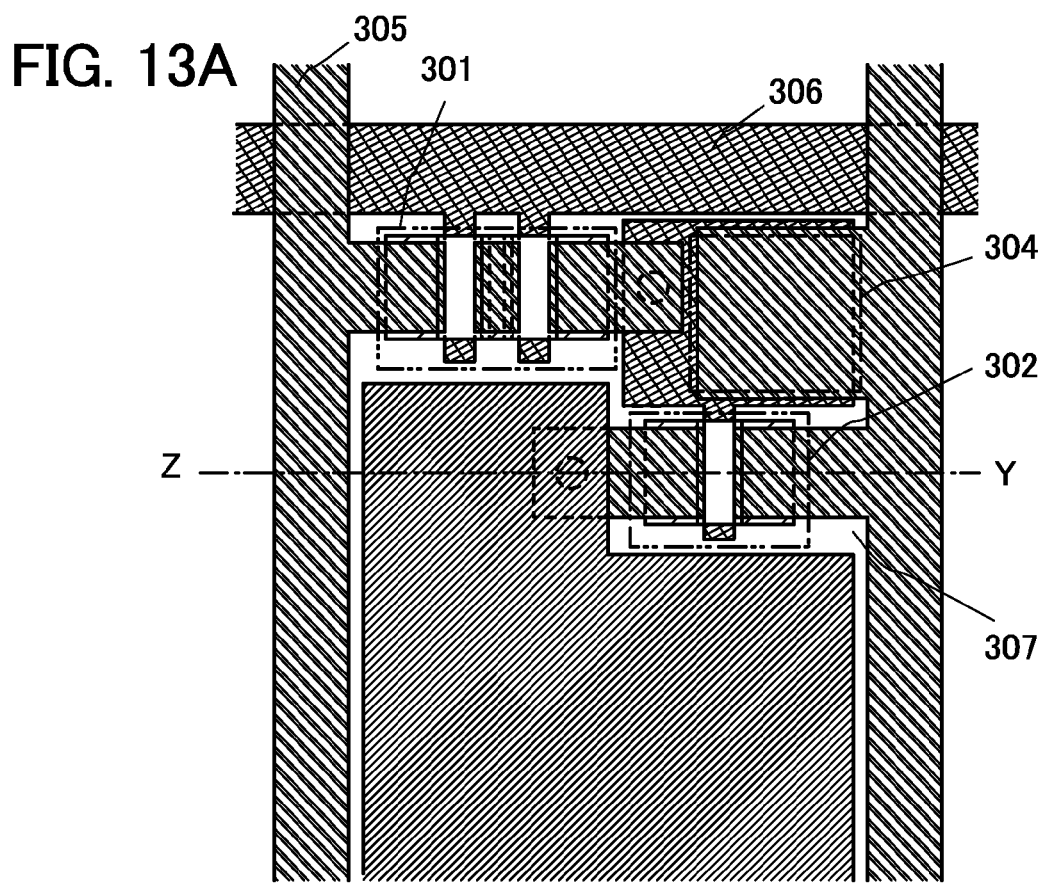
FIGS. 13A and 13B are a top view and a cross-sectional view of a pixel of a light-emitting display device respectively.
Figure 13B:
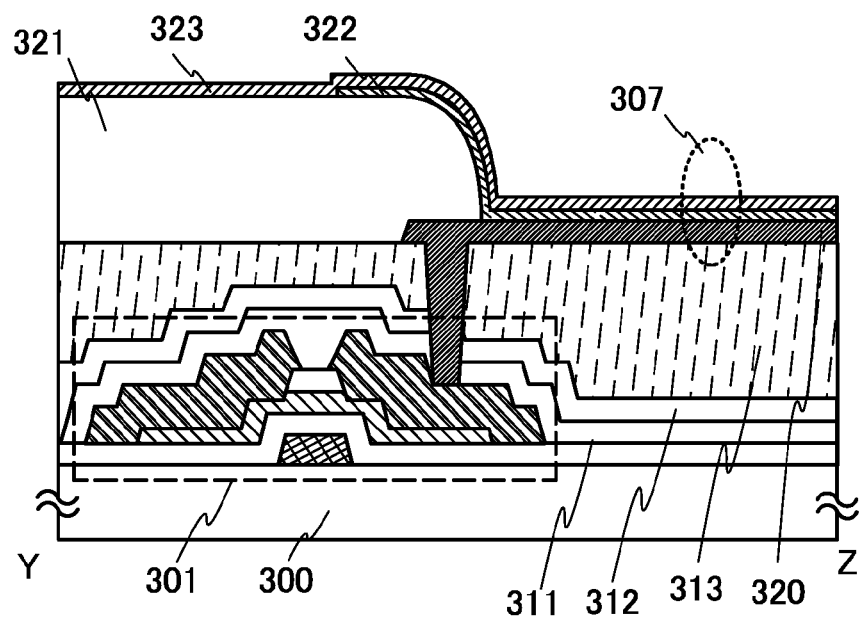
Figure 14:
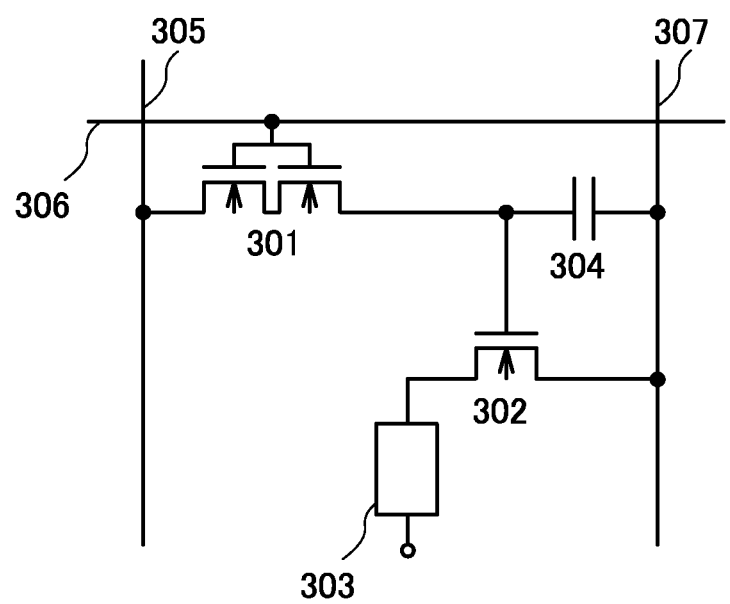
FIG. 14 is an equivalent circuit diagram of a pixel.

FIGS. 13A and 13B illustrate an active-matrix light-emitting display device as an example of a semiconductor device to which one embodiment of the present invention is applied. FIG. 13A is a plan view of the light-emitting display device, and FIG. 13B is a cross-sectional view taken along line Y-Z of FIG. 13A. FIG. 14 shows an equivalent circuit of the light-emitting display device illustrated in FIGS. 13A and 13B.

Thin film transistors 301 and 302 used for a semiconductor device can be manufactured in a manner similar to the thin film transistor described in Embodiment 1 and are highly reliable thin film transistors formed at reduced cost by successive deposition using a sputtering method. The thin film transistors described in Embodiments 2 and 3 can also be used as the thin film transistors 301 and 302 of this embodiment.

The light-emitting display device of this embodiment illustrated in FIG. 13A and FIG. 14 includes a thin film transistor 301 with a multi-gate structure, a thin film transistor 302, a light-emitting element 303, a capacitor element 304, a source wiring layer 305, a gate wiring layer 306, and a power source line 307. The thin film transistors 301 and 302 are n-channel thin film transistors.

In FIG. 13B, the light-emitting display device of this embodiment includes the thin film transistor 302; an insulating layer 311; an insulating layer 312; an insulating layer 313; a partition wall 321; and a first electrode layer 320, an electroluminescent layer 322, and a second electrode layer 323 which are used for the light-emitting element 303.

The insulating layer 313 is preferably formed using an organic resin such as acrylic, polyimide, or polyamide or using siloxane.

Since the thin film transistor 302 in the pixel is n-type in this embodiment, as a cathode, the first electrode layer 320 which is a pixel electrode layer is preferably used. Specifically, for the cathode, a material with a low work function such as Ca, Al, CaF, MgAg, or AlLi can be used.

The partition wall 321 is formed using an organic resin film, an inorganic insulating film, or organic polysiloxane. Particularly preferably, the partition wall 321 is formed using a photosensitive material and an opening is formed over the first electrode layer 320 so that a sidewall of the opening is formed as an inclined surface with continuous curvature.

The electroluminescent layer 322 may be formed using a single layer or a plurality of layers stacked.

The second electrode layer 323 used as an anode is formed to cover the electroluminescent layer 322. The second electrode layer 323 can be formed using a light-transmitting conductive film using any of the light-transmitting conductive materials listed in Embodiment 5 for the pixel electrode layer. The second electrode layer 323 may also be formed using a titanium nitride film or a titanium film instead of the above-described light-transmitting conductive film. The light-emitting element 303 is formed by overlapping of the first electrode layer 320, the electroluminescent layer 322, and the second electrode layer 323. After that, a protective film may be formed over the second electrode layer 323 and the partition wall 321 in order to prevent entry of oxygen, hydrogen, moisture, carbon dioxide, or the like into the light-emitting element 303. As the protective film, a silicon nitride film, a silicon nitride oxide film, a DLC film, or the like can be formed.

Further, in a practical case, preferably, a display device completed in the state illustrated in FIG. 13B is packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 15A to 15C. A cross-sectional structure of a pixel will be described by taking an n-channel driving TFT as an example. Driving TFTs 7001, 7011, and 7021 used for semiconductor devices illustrated in FIGS. 15A to 15C can be manufactured in a manner similar to the thin film transistor described in Embodiment 1 and are highly reliable thin film transistors formed at reduced cost by successive deposition using a sputtering method. Alternatively, any of the thin film transistors described in Embodiments 2 and 3 can be employed as the TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure according to one embodiment of the present invention can be applied to a light-emitting element having any of these emission structures.

A light-emitting element having a top emission structure will be described with reference to FIG. 15A.

Figure 15A:
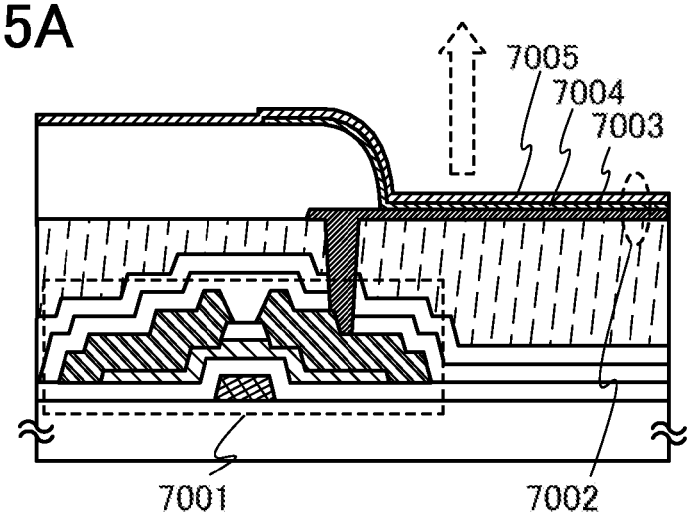
FIGS. 15A to 15C are cross-sectional views of light-emitting elements.

FIG. 15A is a cross-sectional view of a pixel in the case where the driving TFT 7001 is of an n-type and light is emitted from a light-emitting element 7002 to an anode 7005 side. In FIG. 15A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film.

The light-emitting element 7002 corresponds to a region where the cathode 7003 and the anode 7005 sandwich the light-emitting layer 7004. In the case of the pixel illustrated in FIG. 15A, light is emitted from the light-emitting element 7002 to the anode 7005 side as indicated by an arrow.

Next, a light-emitting element having a bottom emission structure will be described with reference to FIG. 15B. FIG. 15B is a cross-sectional view of a pixel in the case where the driving TFT 7011 is of an n-type and light is emitted from a light-emitting element 7012 to a cathode 7013 side. In FIG. 15B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used as in the case of FIG. 15A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 15A, the light-emitting layer 7014 may be formed using either a single layer or a plurality of layers stacked. The anode 7015 is not required to transmit light, but can be formed using a light-transmitting conductive material as in the case of FIG. 15A. As the light-blocking film 7016, a metal or the like that reflects light can be used for example; however, it is not limited to a metal film. For example, a resin or the like to which black pigments are added can also be used.

The light-emitting element 7012 corresponds to a region where the cathode 7013 and the anode 7015 sandwich the light-emitting layer 7014. In the case of the pixel illustrated in FIG. 15B, light is emitted from the light-emitting element 7012 to the cathode 7013 side as indicated by an arrow.

Next, a light-emitting element having a dual emission structure will be described with reference to FIG. 15C. In FIG. 15C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 15A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 15A, the light-emitting layer 7024 may be formed using either a single layer or a plurality of layers stacked. The anode 7025 can be formed using a light-transmitting conductive material as in the case of FIG. 15A.

The light-emitting element 7022 corresponds to a region where the cathode 7023, the light-emitting layer 7024, and the anode 7025 overlap with one another. In the case of the pixel illustrated in FIG. 15C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 15B:
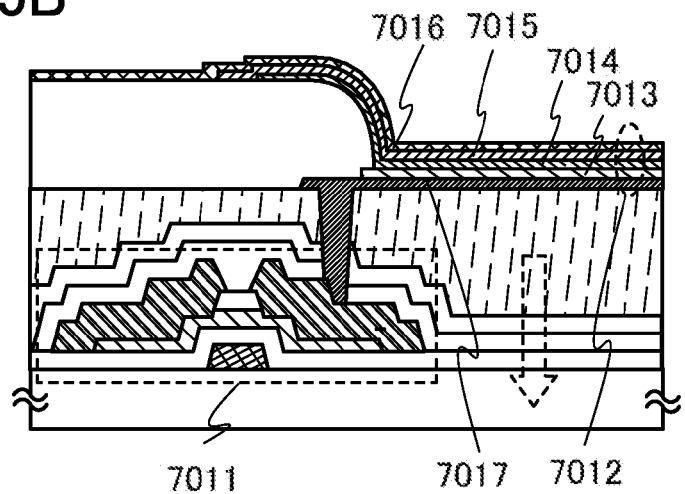
Figure 15C:
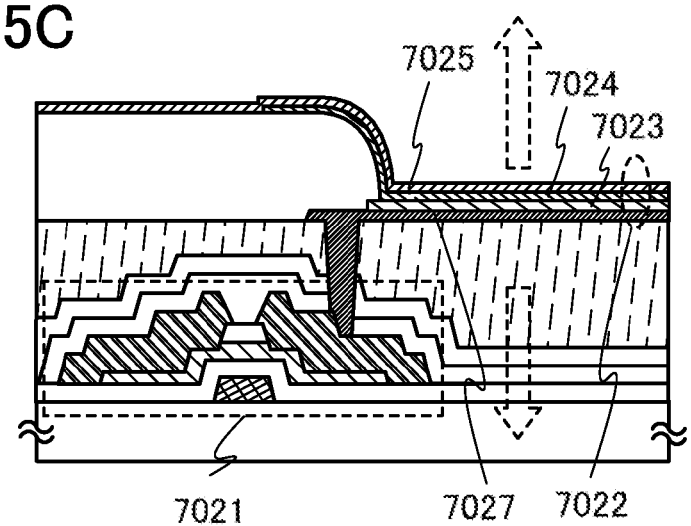

A semiconductor device described in this embodiment is not limited to the structures illustrated in FIGS. 15A to 15C and can be modified in various ways based on the spirit of techniques according to the present invention.

Through the above-described process, a highly reliable light-emitting display device as a semiconductor device can be manufactured.

This embodiment can be combined with any structure described in the other embodiments, as appropriate.

Embodiment 8

Next, a structure of a display panel, which is one embodiment of the semiconductor device of the present invention, will be described below. In this embodiment, a liquid crystal display panel (also referred to as a liquid crystal panel), which is one embodiment of a liquid crystal display device having a liquid crystal element as a display element, and a light-emitting display panel (also referred to as a light-emitting panel), which is one embodiment of a semiconductor device having a light-emitting element as a display element, will be described.

Figure 16A:
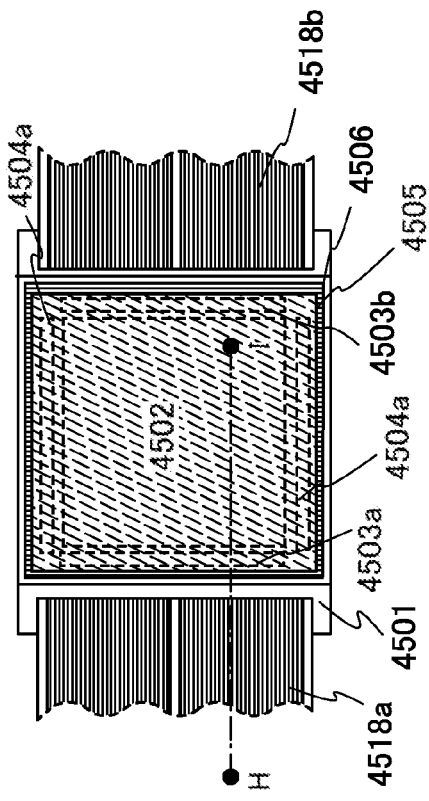
FIGS. 16A and 16B are a top view and a cross-sectional view of a light-emitting module respectively.
Figure 16B:
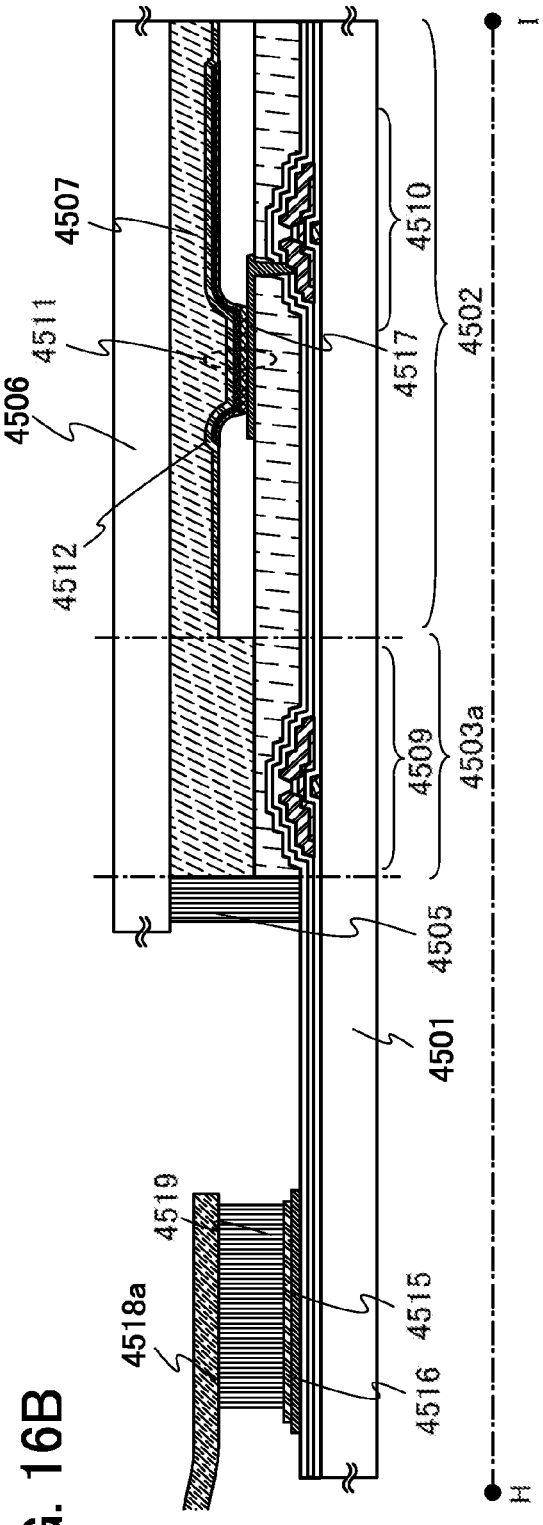

Next, the appearance and a cross section of a light-emitting display panel, which is one embodiment of the semiconductor device of the present invention, will be described with reference to FIGS. 16A and 16B. FIG. 16A is a top view of a panel in which a highly reliable thin film transistor formed at reduced cost by successive deposition using a sputtering method and a light-emitting element are sealed between a first substrate and a second substrate with a sealant. FIG. 16B is a cross-sectional view taken along line H-I of FIG. 16A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506.

The pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 16B.

Each of the thin film transistors 4509 and 4510 corresponds to a thin film transistor formed at reduced cost by successive deposition using a sputtering method, and any of the thin film transistors described in Embodiments 2 and 3 can be applied thereto. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

The connection terminal 4515 is formed with the same conductive film as the second electrode layer 4512, the wiring 4516 is formed with the same conductive film as the first electrode layer 4517 included in the light-emitting element 4511.

The connection terminal 4515 is electrically connected to a terminal included in the FPC 4518*a* through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

As the signal line driver circuits 4503a and 4503b and the scan line driver circuits 4504a and 4504b, driver circuits formed using a single crystal semiconductor film or polycrystalline semiconductor film over a substrate separately prepared may be mounted. Alternatively, only the signal line driver circuits or part thereof, or the scan line driver circuits or part thereof may be separately formed and mounted. This embodiment is not limited to the structure illustrated in FIGS. 16A and 16B.

Next, the appearance and a cross section of a liquid crystal display panel, which is one embodiment of the semiconductor device of the present invention, will be described with reference to FIGS. 17A1, 17A2 and 17B. FIGS. 17A1 and 17A2 are top views of a panel in which highly reliable thin film transistors 4010 and 4011 each having an IGZO semiconductor layer and an IGZO semiconductor layer having an n-type conductivity, and a liquid crystal element 4013 are sealed between a first substrate 4001 and a second substrate 4006 with a sealant 4005. FIG. 17B is a cross-sectional view taken along line M-N of FIGS. 17A1 and 17A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 17A1 illustrates an example of mounting the signal line driver circuit 4003 by a COG method, and FIG. 17A2 illustrates an example of mounting the signal line driver circuit 4003 by a TAB method.

The pixel portion 4002 and the scan line driver circuit 4004 provided over the first substrate 4001 include a plurality of thin film transistors. FIG. 17B exemplifies the thin film transistor 4010 included in the pixel portion 4002 and the thin film transistor 4011 included in the scan line driver circuit 4004.

Each of the thin film transistors 4010 and 4011 corresponds to a thin film transistor formed at reduced cost by successive deposition using a sputtering method, and any of the thin film transistors described in Embodiments 2 and 3 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal layer 4008 with the insulating layers 4032 and 4033 interposed between the pixel electrode layer 4030 and the counter electrode layer 4031.

Note that the first substrate 4001 and the second substrate 4006 can be formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used.

Further, a variety of signals and potentials are supplied to the signal line driver circuit 4003 which is formed separately, the scan line driver circuit 4004, or the pixel portion 4002 from an FPC 4018.

In this embodiment, a connection terminal 4015 is formed using the same conductive film as that of the pixel electrode layer 4030 included in the liquid crystal element 4013, and a wiring 4016 is formed using the same conductive film as that of gate electrode layers of the thin film transistors 4010 and 4011.

The connection terminal 4015 is electrically connected to a terminal included in the FPC 4018 through an anisotropic conductive film 4019.

Note that FIGS. 17A1, 17A2 and 17B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 18:
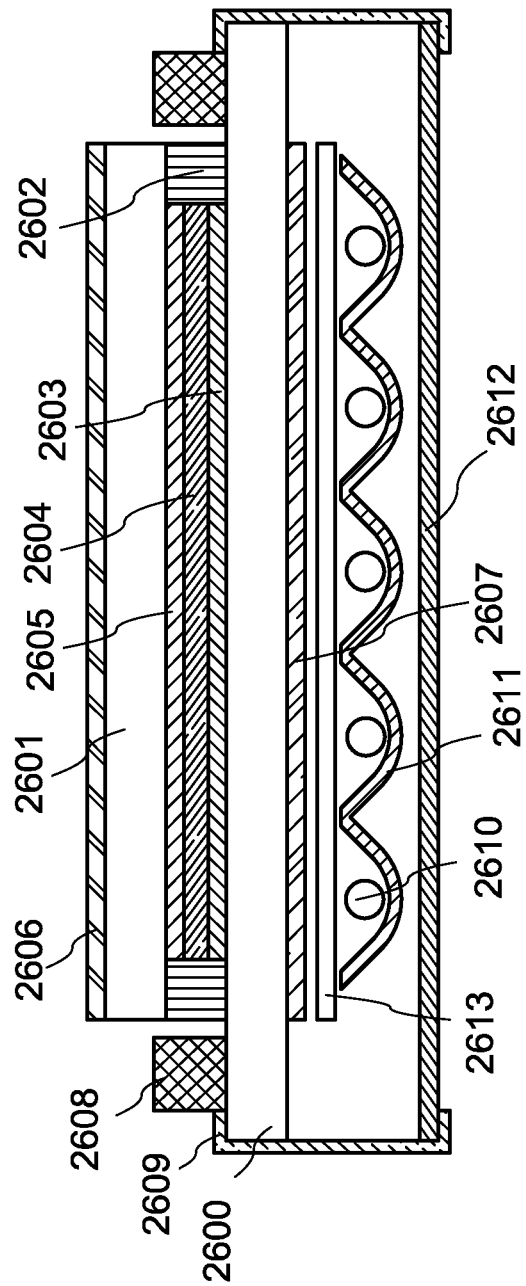
FIG. 18 is a cross-sectional view of a liquid crystal display device.

FIG. 18 illustrates an example in which a liquid crystal display module is formed as a semiconductor device by using a TFT substrate 2600 manufactured according to one embodiment of the present invention.

FIG. 18 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above-described process, a highly reliable display panel as a semiconductor device can be manufactured.

This embodiment can be combined with any structure described in the other embodiments, as appropriate.

Embodiment 9

A semiconductor device according to one embodiment of the present invention can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 19A:
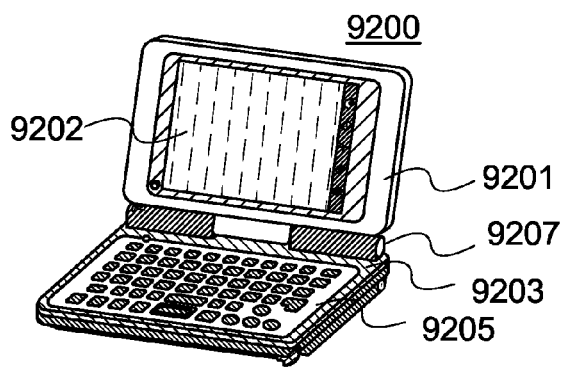
FIGS. 19A to 19D illustrate examples of electronic devices.

FIG. 19A illustrates an example of a portable information terminal device 9200. The portable information terminal device 9200 incorporates a computer and thus can process various types of data. An example of the portable information terminal device 9200 is a personal digital assistant.

The portable information terminal device 9200 has two housings, a housing 9201 and a housing 9203. The housing 9201 and the housing 9203 are joined with a joining portion 9207 such that the portable information terminal device 9200 can be foldable. A display portion 9202 is incorporated in the housing 9201, and the housing 9203 includes a keyboard 9205. Needless to say, the structure of the portable information terminal device 9200 is not limited to the above structure, and the structure may include at least a thin film transistor having a channel protective layer according to one embodiment of the present invention, and additional accessory may be provided as appropriate. According to one embodiment of the present invention, a highly reliable portable information terminal device formed at low cost can be provided.

Figure 19B:
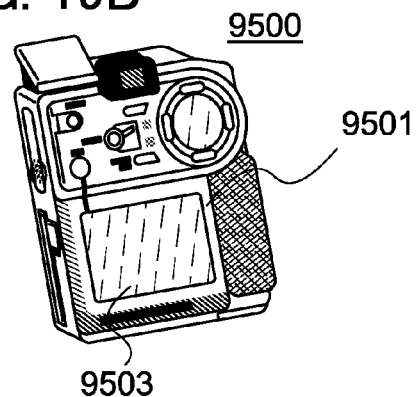

FIG. 19B illustrates an example of a digital video camera 9500. The digital video camera 9500 includes a display portion incorporated in a housing 9501 and various operation portions. Needless to say, the structure of the digital video camera 9500 is not limited to the above structure, and the structure should include at least a thin film transistor having a channel protective layer according to one embodiment of the present invention, and additional accessory may be provided as appropriate. According to one embodiment of the present invention, a highly reliable digital video camera formed at low cost can be provided.

Figure 19C:
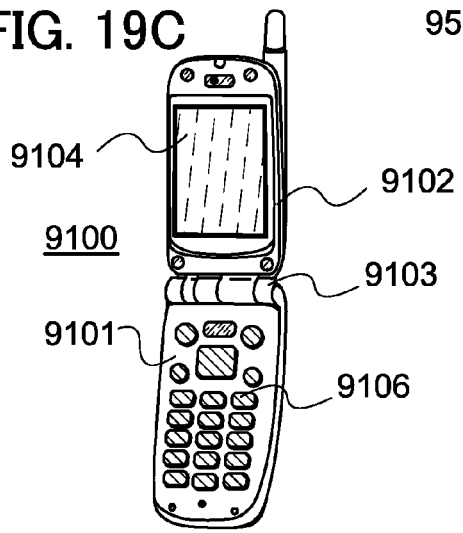

FIG. 19C illustrates an example of a cellular phone 9100. The cellular phone 9100 has two housings, a housing 9102 and a housing 9101. The housing 9102 and the housing 9101 are joined with a joining portion 9103 such that the cellular phone is foldable. A display portion 9104 is incorporated in the housing 9102, and the housing 9101 includes operation keys 9106. Needless to say, the structure of the cellular phone 9100 is not limited to the above structure, and the structure should include at least a thin film transistor having a channel protective layer according to one embodiment of the present invention, and additional accessory may be provided as appropriate. According to one embodiment of the present invention, a highly reliable cellular phone formed at low cost can be provided.

Figure 19D:
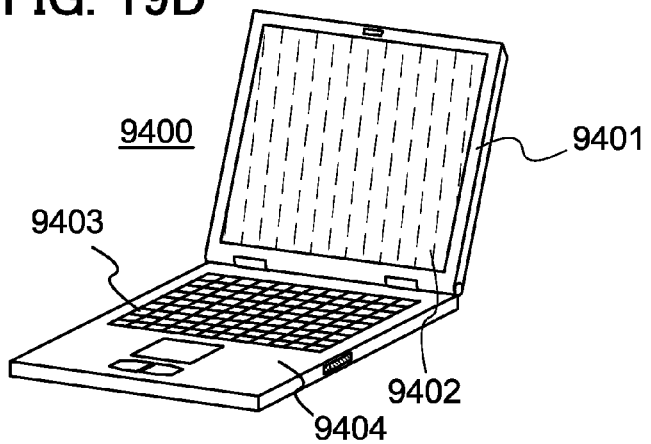

FIG. 19D illustrates an example of a portable computer 9400. The computer 9400 has two housings, a housing 9401 and a housing 9404. The housing 9401 and the housing 404 are joined such that the computer can be open and closed. A display portion 9402 is incorporated in the housing 9401, and the housing 9404 includes a key board 9403. Needless to say, the structure of the computer 9400 is not limited to the above structure, and the structure should include at least a thin film transistor having a channel protective layer according to one embodiment of the present invention, and additional accessory may be provided as appropriate. According to one embodiment of the present invention, a highly reliable computer formed at low cost can be provided.

Figure 20:
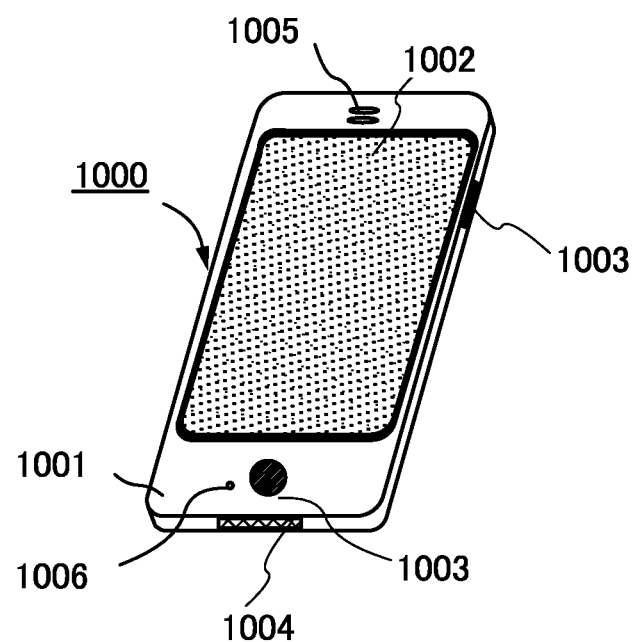
FIG. 20 illustrates an example of an electronic device.

FIG. 20 illustrates an example of a cellular phone 1000 which is different from that illustrated in FIG. 19C. The cellular phone 1000 includes a display portion 1002 incorporated in a housing 1001, an operation button 1003, an external connection port 1004, a speaker 1005, a microphone 1006 and the like.

In the cellular phone 1000 illustrated in FIG. 20, data can be input when a person touches the display portion 1002 with his/her finger or the like. In addition, operations such as phone call or mailing can be conducted when a person touches the display portion 1002 with his/her finger or the like.

There are mainly three screen modes of the display portion 1002: the first mode is a display mode mainly for displaying an image; the second mode is an input mode mainly for inputting data such as text; and the third mode is a display-and-input mode in which two modes of the display mode and the input mode are combined.

For example, in the case of calling or mailing, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

Figure 21A:
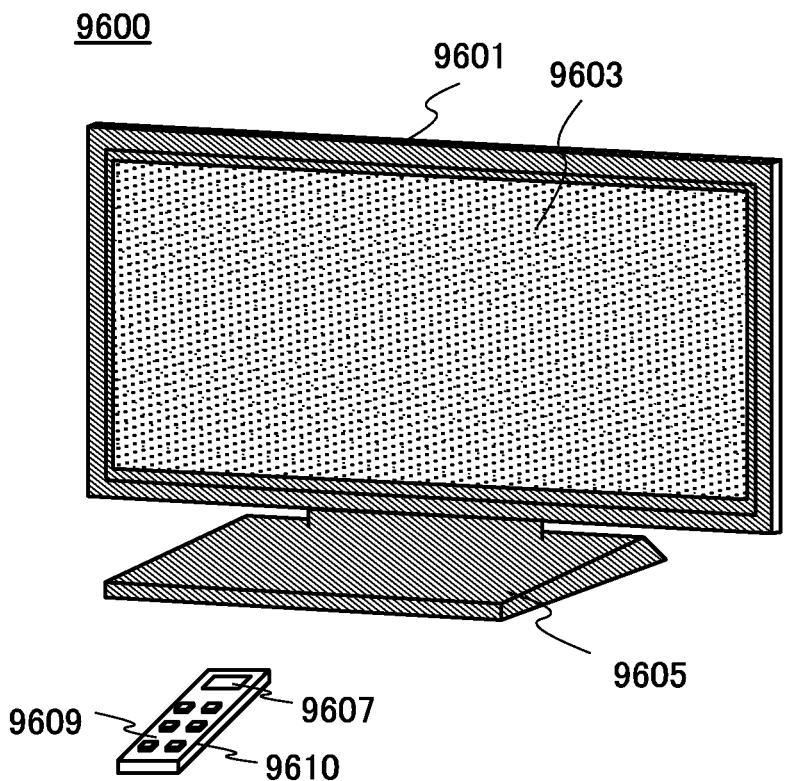
FIGS. 21A and 21B each illustrate an example of an electronic device.

FIG. 21A illustrates an example of a television set 9600. In the television set 9600, a display portion 9603 is incorporated in a housing 9601. The display portion 9603 can display an image. Further, the housing 9601 is supported by a stand 9605 here. There are no particular limitations on the structure of the television set 9600. The structure may have at least a thin film transistor including a channel protective layer according to one embodiment of the present invention, and may include addition equipment as appropriate. A highly reliable television set formed at low cost can be realized according to one embodiment of the present invention.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and/or the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 21B:
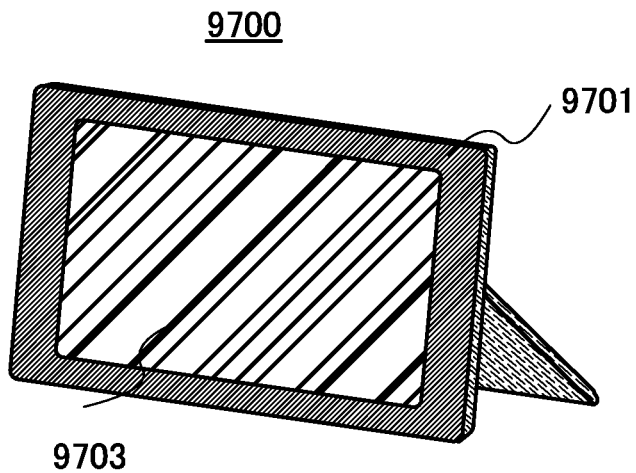

FIG. 21B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame. There are no particular limitations on the structure of the digital photo frame 9700. The structure may have at least a thin film transistor including a channel protective layer according to one embodiment of the present invention, and may include addition equipment as appropriate. A highly reliable digital photo frame formed at low cost can be realized according to one embodiment of the present invention.

Note that the digital photo frame 9700 is provided with an operation portion, an external connection portion (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred into the digital photo frame 9700 and displayed on the display portion 9703.

The digital photo frame 9700 may transmit and receive data wirelessly. The structure may be employed in which desired image data is transferred into the digital photo frame 9700 wirelessly to be displayed.

A thin film transistor having a channel protective layer according to one embodiment of the present invention can be applied to electronic paper. The electronic paper can be used for electronic devices of various fields, which display information. For example, the electronic paper can be applied to an electronic book device (including e-book readers and electronic books), posters, advertisements on vehicles such as trains, displays on various cards such as credit cards, or the like. Examples of the electronic devices are illustrated in FIG. 22 and FIG. 23.

Figure 22:
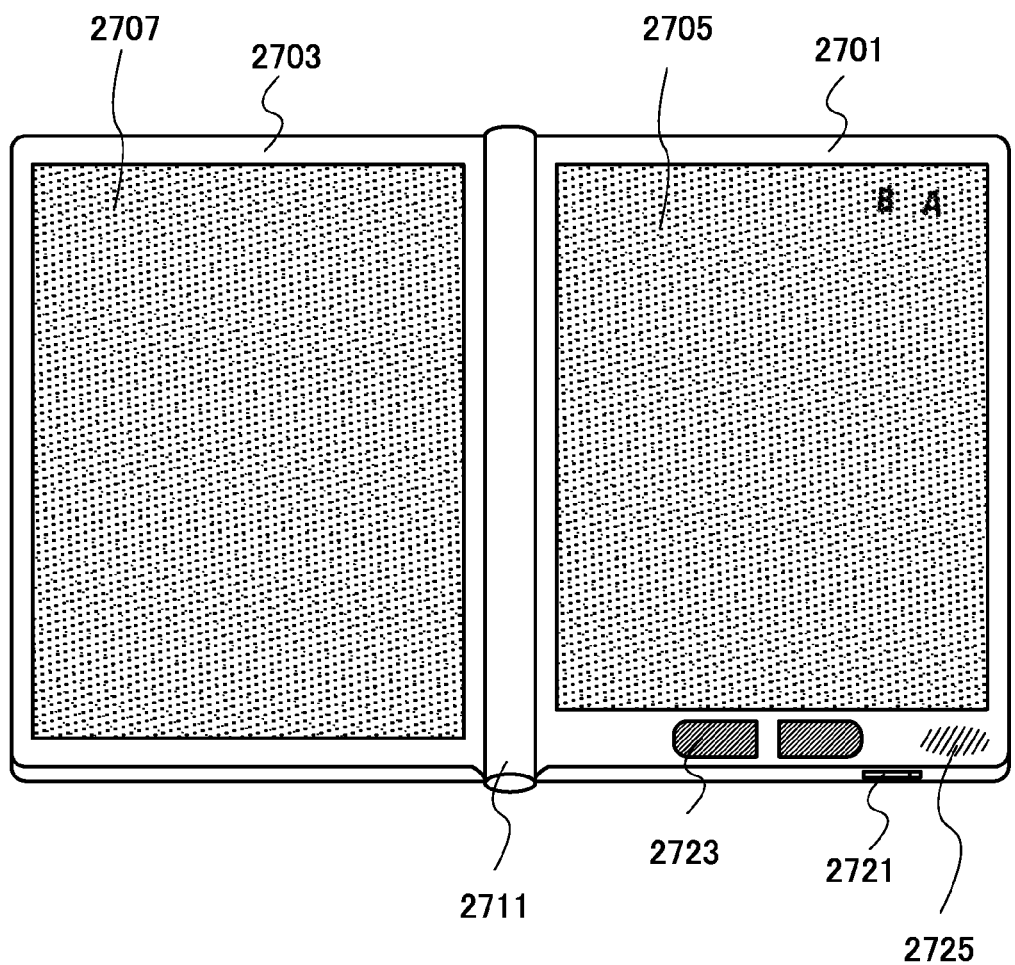
FIG. 22 illustrates an example of an electronic device.
Figure 23:
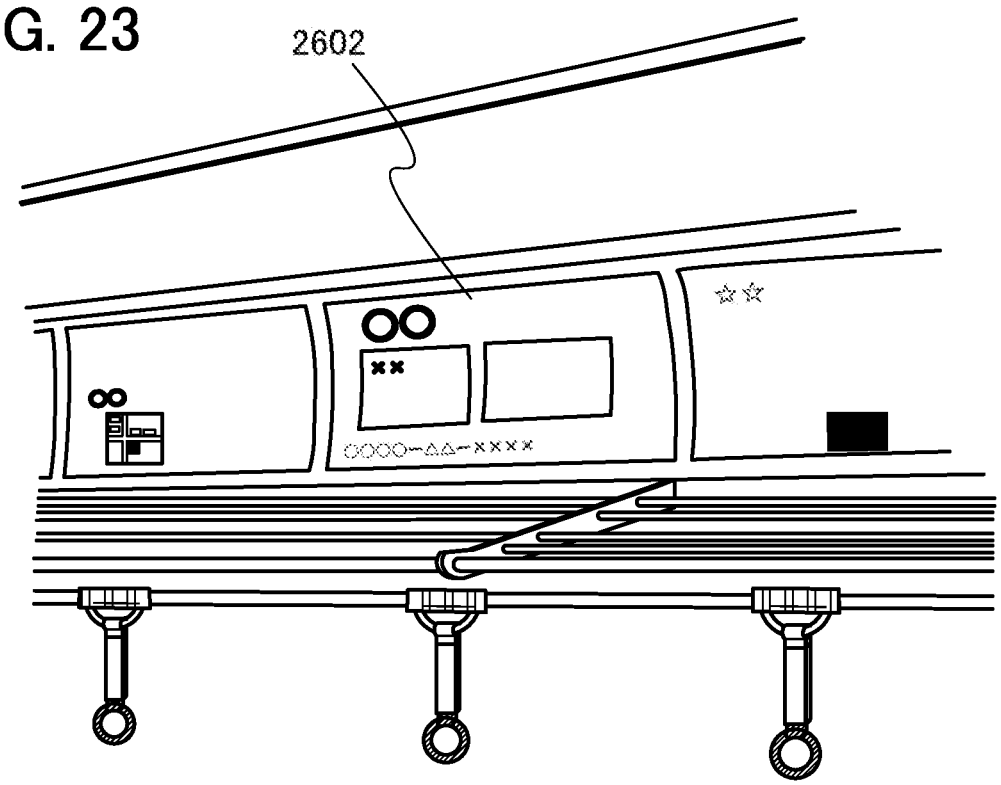
FIG. 23 illustrates an example of an electronic device.

FIG. 22 is an example of an electronic book device 2700. For example, the electronic book device 2700 includes two housings, a housing 2701 and a housing 2703. The housings 2701 and 2703 are connected by a hinge portion 2711 and can be opened or closed with the hinge portion 2711. With such a structure, the electronic book device 2700 can be handled like a book made of paper.

A display portion 2705 is incorporated in the housing 2701 and a display portion 2707 is incorporated in the housing 2703. The display portions 2705 and 2707 may display one image or different images separately. With a structure in which different images are displayed, for example, text is displayed on the display portion on the right side (the display portion 2705 in FIG. 22) while an image is displayed on the display portion on the left side (the display portion 2707 in FIG. 22).

FIG. 22 illustrates an example in which the housing 2701 is provided with an operation portion and the like. For example, the housing 2701 is provided with a power source 2721, an operation key 2723, a speaker 2725, and the like. With the operation key 2723, pages which are displayed are changed. Note that a keyboard, a pointing device, or the like may be provided in the same plane as that of the display portion of the housing. In addition, a rear surface or a side surface of the housing may be provided with an external connection terminal (an earphone terminal, a USB terminal, a terminal which can be connected to an AC adapter or various cables such as a USB cable, or the like), a recording medium insert portion, or the like. Further, the electronic book device 2700 may have a function as an electronic dictionary.

Note that the electronic book device 2700 may have a configuration capable of wirelessly transmitting and receiving data. With wireless communication, desired book data or the like can be purchased and downloaded from servers for electronic books. There are no particular limitations on the structure of the electronic book device 2700. The structure may have at least a thin film transistor including a channel protective layer according to one embodiment of the present invention, and may include addition equipment as appropriate. An electronic book device formed at low cost can be realized according to one embodiment of the present invention.

FIG. 23 illustrates a car card advertising device 3602 on a train or the like. In a case where an advertising medium is paper, a man replaces advertising, but in a case where it is electronic paper, much manpower is not needed and replacement of advertising can be conducted in short time. Further, images can be displayed stably without breaking a displayed image. In addition, information of the advertising may be transmitted and received wirelessly. There are no particular limitations on the structure of such advertizing device. The structure may have at least a thin film transistor including a channel protective layer according to one embodiment of the present invention, and may include addition equipment as appropriate. A highly reliable advertising device formed at low cost can be realized according to one embodiment of the present invention.

This embodiment can be freely combined with any of Embodiments 1 to 8.

This application is based on Japanese Patent Application serial no. 2008-197127 filed with Japan Patent Office on Jul. 31, 2008, the entire contents of which are hereby incorporated by reference.

What is claimed is:

1. A display device comprising:
a transistor comprising:
a gate electrode over a substrate;
a first insulating layer comprising silicon nitride over the gate electrode;
a second insulating layer comprising silicon oxide over the first insulating layer;
an oxide semiconductor layer comprising a channel formation region overlapping the gate electrode with the first insulating layer and the second insulating layer therebetween;
a third insulating layer comprising silicon oxide over the channel formation region; and
a source electrode and a drain electrode over the third insulating layer;
a fourth insulating layer comprising silicon oxide over the source electrode and the drain electrode;
a fifth insulating layer comprising an organic material over the fourth insulating layer; and
a light-emitting element comprising:
a first electrode over the fifth insulating layer;
an electroluminescent layer over the first electrode; and
a second electrode over the electroluminescent layer; and
a protective film comprising silicon nitride over the light-emitting element,
wherein the first electrode is electrically connected to one of the source electrode and the drain electrode of the transistor, and
wherein the transistor has a single-gate structure.

2. The display device according to claim 1, wherein the first electrode is in direct contact with the one of the source electrode and the drain electrode of the transistor.

3. The display device according to claim 1, further comprising a sixth insulating layer comprising silicon nitride between the fourth insulating layer and the sixth insulating layer.

4. A display module including the display device according to claim 1.

5. A television including the display device according to claim 1.

6. A display device comprising a pixel comprising:
a first transistor;
a second transistor, wherein each of the first transistor and the second transistor comprises:
a gate electrode over a substrate;
a first insulating layer comprising silicon nitride over the gate electrode;
a second insulating layer comprising silicon oxide over the first insulating layer;
an oxide semiconductor layer comprising a channel formation region overlapping the gate electrode with the first insulating layer and the second insulating layer therebetween;
a third insulating layer comprising silicon oxide over the channel formation region; and
a source electrode and a drain electrode over the third insulating layer;
a fourth insulating layer comprising silicon oxide over the source electrode and the drain electrode;
a fifth insulating layer comprising an organic material over the fourth insulating layer;
a capacitor; and
a light-emitting element, the light-emitting element comprising:
a first electrode over the fifth insulating layer;
an electroluminescent layer over the first electrode; and
a second electrode over the electroluminescent layer,
wherein one of the source electrode and the drain electrode of the first transistor is electrically connected to a source wiring,
wherein the other of the source electrode and the drain electrode of the first transistor is electrically connected to one electrode of the capacitor,
wherein the gate electrode of the second transistor is electrically connected to the one electrode of the capacitor,
wherein one of the source electrode and the drain electrode of the second transistor is electrically connected to the first electrode of the light-emitting element, and
wherein the other of the source electrode and the drain electrode of the second transistor is electrically connected to a power source line.

7. The display device according to claim 6,
wherein the one electrode of the capacitor comprises the same material and is provided on the same surface as the source electrode and the drain electrode, and
wherein the other electrode of the capacitor comprises the same material and is provided on the same surface as the gate electrode.

8. The display device according to claim 6, wherein the first electrode is in direct contact with the one of the source electrode and the drain electrode of the second transistor.

9. The display device according to claim 6, wherein the first transistor and the second transistor each have a single-gate structure.

10. The display device according to claim 6, further comprising a sixth insulating layer comprising silicon nitride between the fourth insulating layer and the sixth insulating layer.

11. A display module including the display device according to claim 6.

12. A television including the display device according to claim 6.

13. A display device comprising a pixel comprising:
a first transistor;
a second transistor, wherein each of the first transistor and the second transistor comprises:
a gate electrode comprising copper over a substrate;
a first insulating layer comprising silicon nitride over the gate electrode;
a second insulating layer comprising silicon oxide over the first insulating layer;
an oxide semiconductor layer comprising a channel formation region comprising indium, gallium, and zinc and overlapping the gate electrode with the first insulating layer and the second insulating layer therebetween;
a third insulating layer comprising silicon oxide over the channel formation region; and
a source electrode and a drain electrode comprising titanium over the third insulating layer;
a fourth insulating layer comprising silicon oxide over the source electrode and the drain electrode;
a fifth insulating layer comprising an organic material over the fourth insulating layer;
a capacitor; and
a light-emitting element, the light-emitting element comprising:
a first electrode comprising indium tin oxide over the fifth insulating layer;
an electroluminescent layer over the first electrode; and
a second electrode comprising aluminum over the electroluminescent layer, wherein one of the source electrode and the drain electrode of the first transistor is electrically connected to a source wiring, wherein the other of the source electrode and the drain electrode of the first transistor is electrically connected to one electrode of the capacitor, wherein the gate electrode of the second transistor is electrically connected to the one electrode of the capacitor, wherein one of the source electrode and the drain electrode of the second transistor is electrically connected to the first electrode of the light-emitting element, wherein the other of the source electrode and the drain electrode of the second transistor is electrically connected to a power source line, and wherein a protective film comprising silicon nitride is provided over the light-emitting element.

14. The display device according to claim 13, wherein the one electrode of the capacitor comprises the same material and is provided on the same surface as the source electrode and the drain electrode, and wherein the other electrode of the capacitor comprises the same material and is provided on the same surface as the gate electrode.

15. The display device according to claim 13, wherein the first electrode is in direct contact with the one of the source electrode and the drain electrode of the second transistor.

16. The display device according to claim 13, wherein the first transistor and the second transistor each have a single-gate structure.

17. The display device according to claim 13, further comprising a sixth insulating layer comprising silicon nitride between the fourth insulating layer and the sixth insulating layer.

18. A display module including the display device according to claim 13.

19. A television including the display device according to claim 13.

* * * * *